(12) United States Patent
Lin

(10) Patent No.: US 7,443,743 B2
(45) Date of Patent: Oct. 28, 2008

(54) METHOD AND SYSTEM FOR IMPROVED EFFICIENCY OF SYNCHRONOUS MIRROR DELAYS AND DELAY LOCKED LOOPS

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/837,631

(22) Filed: Aug. 13, 2007

(65) Prior Publication Data

US 2007/0273417 A1   Nov. 29, 2007

Related U.S. Application Data

(62) Division of application No. 11/138,206, filed on May 26, 2005.

(51) Int. Cl.
*G11C 7/00* (2006.01)
*G11C 8/00* (2006.01)
*G11C 8/18* (2006.01)
*H03L 7/00* (2006.01)
*H03L 7/06* (2006.01)

(52) U.S. Cl. .................. 365/194; 365/191; 365/233.11; 365/233.12; 365/233.5; 327/145; 327/146; 327/152; 327/153

(58) Field of Classification Search .................. 365/191, 365/194, 233, 233.5, 233.1, 233.11, 233.12; 327/8, 141, 144, 145, 146, 147, 152
See application file for complete search history.

(56) References Cited

U.S. PATENT DOCUMENTS 3,947,697 A   3/1976   Archer et al.

| 5,173,617 A | 12/1992 | Alsup et al. |
| 5,223,755 A | 6/1993 | Richley |
| 5,771,264 A | 6/1998 | Lane |
| 5,936,912 A | 8/1999 | Kawabata et al. |
| 5,940,608 A | 8/1999 | Manning |
| 5,955,904 A | 9/1999 | Kawasaki |
| 5,963,069 A | 10/1999 | Jefferson et al. |

(Continued)

OTHER PUBLICATIONS

Wang, Yi-Ming et al., A Reliable Low-Power Fast Skew-Compensation Circuit, Proceedings of the 2004 Asia and South Pacific Design Automation Conference (ASP-DAC'04).

(Continued)

*Primary Examiner*—Ly D Pham
(74) *Attorney, Agent, or Firm*—Whyte Hirschboeck Dudek SC

(57) ABSTRACT

A plurality of improved memory systems employing a phase detection system in conjunction with either a synchronous mirror delay or a delay-locked loop, and related methods of operation, are disclosed. The memory systems determine timing characteristics among multiple signals and, based upon those timing characteristics, vary which clock-related signal is output. The improvement relates in part to the incorporation of a clock divider that reduces the frequency of the clock signals utilized by the system. Due to the incorporation of the clock divider and an edge recovery device, attenuation, power dissipation and duty cycle distortion associated with propagation of the clock signal(s) are reduced. Further, the reduction in frequency of the clock signals allows for numerous differently-phased clock signals to be generated within the system, which allows for finer timing comparisons to be performed, thus allowing for finer selections to be made in relation to which clock-related signal is output.

32 Claims, 16 Drawing Sheets

U.S. PATENT DOCUMENTS

| | | | | |
|---|---|---|---|---|
| 5,999,027 | A | 12/1999 | Yamazaki | |
| 6,018,259 | A | 1/2000 | Lee | |
| 6,069,506 | A | 5/2000 | Miller, Jr. et al. | |
| 6,069,507 | A | 5/2000 | Shen et al. | |
| 6,128,248 | A | 10/2000 | Idei et al. | |
| 6,140,854 | A | 10/2000 | Coddington et al. | |
| 6,166,990 | A | 12/2000 | Ooishi et al. | |
| 6,172,537 | B1 | 1/2001 | Kanou et al. | |
| 6,181,184 | B1 | 1/2001 | Yamazaki et al. | |
| 6,184,753 | B1 | 2/2001 | Ishimi et al. | |
| 6,205,086 | B1 | 3/2001 | Hanzawa et al. | |
| 6,215,726 | B1 | 4/2001 | Kubo | |
| 6,242,954 | B1 * | 6/2001 | Taniguchi et al. | 327/149 |
| 6,281,726 | B1 | 8/2001 | Miller, Jr. | |
| 6,373,303 | B2 * | 4/2002 | Akita | 327/156 |
| 6,373,913 | B1 | 4/2002 | Lee | |
| 6,437,417 | B1 | 8/2002 | Gilton | |
| 6,437,616 | B1 | 8/2002 | Antone et al. | |
| 6,465,828 | B2 | 10/2002 | Agarwal | |
| 6,466,073 | B1 | 10/2002 | Yukinari et al. | |
| 6,469,493 | B1 | 10/2002 | Muething et al. | |
| 6,522,182 | B2 * | 2/2003 | Tomita et al. | 327/158 |
| 6,611,475 | B2 | 8/2003 | Lin | |
| 6,618,283 | B2 | 9/2003 | Lin | |
| 6,628,154 | B2 | 9/2003 | Fiscus | |
| 6,636,110 | B1 | 10/2003 | Ooishi et al. | |
| 6,642,762 | B2 | 11/2003 | Von Kaenel | |
| 6,680,874 | B1 | 1/2004 | Harrison | |
| 6,703,879 | B2 * | 3/2004 | Okuda et al. | 327/158 |
| 6,798,259 | B2 | 9/2004 | Lin | |
| 6,836,166 | B2 | 12/2004 | Lin et al. | |
| 6,839,301 | B2 | 1/2005 | Lin et al. | |
| 6,930,525 | B2 | 8/2005 | Lin et al. | |
| 6,943,610 | B2 | 9/2005 | Saint-Laurent | |
| 6,970,521 | B2 * | 11/2005 | Dosho | 375/340 |
| 6,987,701 | B2 | 1/2006 | Lin et al. | |
| 7,042,971 | B1 | 5/2006 | Flanagan et al. | |
| 7,072,242 | B2 | 7/2006 | Okuda et al. | |
| 2001/0000426 | A1 | 4/2001 | Sung et al. | |
| 2001/0043097 | A1 | 11/2001 | Akita | |
| 2002/0008558 | A1 | 1/2002 | Okuda et al. | |
| 2002/0017939 | A1 * | 2/2002 | Okuda et al. | 327/296 |
| 2002/0031042 | A1 | 3/2002 | Kim et al. | |
| 2002/0036525 | A1 | 3/2002 | Hwang | |
| 2002/0157031 | A1 | 10/2002 | Lin | |
| 2002/0180500 | A1 | 12/2002 | Okuda et al. | |
| 2003/0002316 | A1 * | 1/2003 | Morita et al. | 365/63 |
| 2003/0103407 | A1 * | 6/2003 | Ooishi et al. | 365/233 |
| 2004/0076055 | A1 | 4/2004 | Harrison | |
| 2004/0251936 | A1 * | 12/2004 | Gomm | 327/141 |
| 2005/0140407 | A1 | 6/2005 | Lin | |

OTHER PUBLICATIONS

Wang, Yi-Ming et al., IEEE Journal of Sold-State Circuits, vol. 39, No. 6, Jun. 2004, pp. 906-918.

Matano, Tatsuya, et al., IEEE Journal of Solid-State Circuits, vol. 38, No. 5, May 2003, pp. 762-766.

* cited by examiner

FIG. 5

| | PH1 (32) | PH2 (34) | CONDITIONS | |
|---|---|---|---|---|
| (1) | 0 | 0 | $t_{ck} - t_{mdl}$ | $(t_{mdl} > \frac{t_{ck}}{2})$ |
| (2) | 1 | 1 | $\frac{t_{ck}}{2} - t_{mdl}$ | $(t_{mdl} < \frac{t_{ck}}{2})$ |
| (3) | 1 | 0 | $t_{mdl} = t_{ck}$ | (LOCKED) |
| (4) | 0 | 1 | $t_{mdl} = \frac{t_{ck}}{2}$ | (LOCKED) |

FIG. 10

| | PH1 | PH2 | PH11 | PH21 | CONDITIONS |
|---|---|---|---|---|---|
| A | 0 | 0 | 0 | 0 | $t_{ck} - t_{mdl}\ (t_{mdl} > \tfrac{3}{4} t_{ck})$ |
| B | 1 | 1 | 1 | 1 | $\tfrac{t_{ck}}{2} - t_{mdl}\ (\tfrac{t_{ck}}{2} > t_{mdl} > \tfrac{t_{ck}}{4})$ |
| C | 0 | 0 | 1 | 1 | $\tfrac{3}{4} t_{ck} - t_{mdl}\ (\tfrac{3 t_{ck}}{4} > t_{mdl} > \tfrac{t_{ck}}{2})$ |
| D | 1 | 1 | 0 | 0 | $\tfrac{t_{ck}}{4} - t_{mdl}\ (t_{mdl} > \tfrac{t_{ck}}{4})$ |
| E | 1 | 0 | 0 | 0 | $t_{mdl} = t_{ck}$ (LOCKED) |
| F | 0 | 1 | | | $t_{mdl} = \tfrac{t_{ck}}{2}$ (LOCKED) |
| G | | | 1 | 0 | $t_{mdl} = \tfrac{t_{ck}}{4}$ (LOCKED) |
| H | | | 0 | 1 | $t_{mdl} = \tfrac{3}{4} t_{ck}$ (LOCKED) |

METHOD AND SYSTEM FOR IMPROVED EFFICIENCY OF SYNCHRONOUS MIRROR DELAYS AND DELAY LOCKED LOOPS

CROSS REFERENCE TO RELATED APPLICATION

This application is a divisional of U.S. patent application Ser. No. 11/138,206, filed May 26, 2005.

BACKGROUND OF THE INVENTION

The present invention relates generally to the field of integrated circuits. More particularly, the invention relates to circuits that will synchronize the internal timing or clock signals within an integrated circuit such as a synchronous dynamic random access memory (SDRAM) to external timing or clock signals.

Most digital logic implemented on integrated circuits is clocked synchronous sequential logic. In electronic devices such as synchronous dynamic random access memory circuits (SDRAMs), microprocessors, digital signal processors, and so forth, the processing, storage, and retrieval of information is coordinated with a clock signal. The speed and stability of the clock signal determines to a large extent the data rate at which a circuit can function. Many high-speed integrated circuit devices, such as SDRAMs, microprocessors, etc., rely upon clock signals to control the flow of commands, data, addresses, etc., into, through and out of the devices.

A continual demand exists for devices with higher data rates; consequently, circuit designers have begun to focus on ways to increase the frequency of the clock signal. In SDRAMs, it is desirable to have the data output from the memory synchronized with the system clock that also serves the microprocessor. The delay between a rising edge of the system clock (external to the SDRAM) and the appearance of valid data at the output of the memory circuit is known as the clock access time of the memory. A goal of memory circuit designers is to minimize clock access time as well as to increase clock frequency.

One of the obstacles to reducing clock access time has been clock skew, that is, the delay time between the externally supplied system clock signal and the signal that is routed to the memory's output circuitry. An external system clock is generally received with an input buffer and then further shaped and redriven to the internal circuitry by an internal buffer. The time delay of the input buffer and the internal buffer will skew the internal clock from the external clock. This clock skew will cause signals that are to be transferred from the integrated circuit to be out of synchronization with the external system clock. This skew in the clock signal internal to the integrated circuit is furthered by the delays incurred in the signal passing through the clock input buffer and driver and through any associated resistive-capacitive circuit elements. One solution to the problem of clock skew is the use of a synchronous mirror delay, and another is the use of delay-locked loops.

Delay-locked loops (DLL) are feedback circuits used for synchronizing an external clock and an internal clock with each other. Typically, a DLL operates to feed back a phase difference-related signal to control a delay line, until the timing of one clock signal is advanced or delayed until its rising edge is coincident with the rising edge of a second clock signal.

A synchronous mirror delay circuit (SMD) is a circuit for synchronizing an external clock and an internal clock with each other. The SMD can acquire lock generally within two clock cycles. The SMD has a period of delay, known as a delay range. The delay range of the SMD determines the actual operating range, or clock frequency, within which the integrated circuits (ICs) can operate. In other words, it is desired to reduce the number of delay stages required in the SMD while maintaining the lock delay range. One goal is to improve the efficiency of the SMD to maintain the proper operating range and to reduce the required area and power consumption of the SMD.

For the conventional SMD implementations, two delay lines are required, one for delay measurement, one for variable mirrored delay. The effective delay length for both delay lines is defined as:

$$t_{delay} = t_{ck} - t_{mdl}$$

where $t_{ck}$ is the clock period, $t_{mdl}$ is the delay of I/O model, including clock input buffer, receiver, clock tree and driver logic. The delay stages required for each delay line is given by:

$$N = \frac{t_{delay}}{t_d} = \frac{t_{ck} - t_{mdl}}{t_d}$$

where $t_d$ is the delay per stage. The worst case number is given by:

$$N_{worst} = \frac{t_{ck}(\text{long}) - t_{mdl}(\text{fast})}{t_d(\text{fast})}$$

For example, where $t_{ck}$ (long)=5 ns (as in a 200 MHz bus), $t_{mdl}$ (fast)=1 ns and $t_d$ (fast)=110 ps, $$N_{worst} = \frac{5\text{ns} - 1\text{ns}}{110\text{ps}} \approx 36$$

For two delay lines in an SMD, a total of 72 stages are needed to adjust the delay.

When locking, $t_{lock} = d_{in} + t_{mdl} + (t_{ck} - t_{mdl})$ (measured)$\approx (t_{ck} - t_{mdl})$ (variable)$+ d_{out}$. This is the conventional equation to calculate the lock time of the SMD, which is generally two clock cycles, based on sampling from one rising edge to the next rising edge of the internal clock signal. It is desirable to reduce the effective delay stages employed in the SMD while maintaining the lock range.

When creating and propagating high-frequency clock signals, a number of problems can arise. To begin with, it can be difficult to propagate or distribute a high-frequency clock signal across a large die with little or modest amounts of attenuation. Further, it is difficult to achieve the application/propagation of a high-frequency clock signal without the use of relatively large amounts of power. As older, relatively high voltage power supplies such as 2.5 V power supplies are replaced with newer, lower voltage power supplies (e.g., 1.5 V or even approaching 1 V power supplies), the propagation of clock signals becomes progressively more difficult, since the lower voltage of the power supplies results in smaller swings in voltage, which in turn results in less current and less drive for those clock signals. Third, the use of a high-frequency clock signal can introduce undesirably high amounts of duty cycle distortion into the circuitry utilizing that clock signal, something which can change the outcome of (or render uncertain) the operation of that circuitry insofar as both the rising and falling edge information of a clock signal is used or useful in many circumstances.

Therefore, it would be advantageous if improved circuits for generating/providing synchronized clock signals could be developed. It would be particularly advantageous if such signals could be provided and propagated without excessive amounts of attenuation and without a need for large amounts of power. Additionally, it would be advantageous if such clock signals could be provided without the introduction of undesirably high amounts of duty cycle distortion.

SUMMARY OF THE INVENTION

The present invention improves the performance of memory circuits and, in particular, reduces the amount of attenuation, power dissipation, and duty cycle distortion occurring with the operation of such memory circuits. The present invention achieves this improved performance by employing a clock divider to reduce the frequency of the clock signals utilized by the memory circuits in relation to the initial, external clock signal received by those memory circuits. In at least some embodiments, the memory circuits further include an edge recovery or phase generation circuit to allow for the recovery of edge information that can be lost due to operation of the clock divider, and to further alleviate duty cycle distortion. Further, in at least some embodiments, the clock divider produces not merely one but rather several reduced-frequency clock signals that respectively have different phases. Through the use of these multiple reduced-frequency clock signals, finer timing determinations can be made than would otherwise be possible.

More particularly, in at least some embodiments, the present invention relates to a method of operating a synchronous mirror delay circuit. The method includes receiving a first clock signal, reducing an initial frequency of the first clock signal to provide a plurality of modified clock signals with a reduced frequency, and providing a delay signal that shares the reduced frequency of the modified clock signals. The method additionally includes detecting phase information concerning at least two of the delay signal and the modified clock signals, and selectively directing a signal related to one of the modified clock signals into a synchronous mirror delay (SMD) based upon the detected phases.

Additionally, in at least some embodiments, the present invention relates to a method of operating a delay-locked loop circuit. The method includes receiving a first clock signal, generating a plurality of modified clock signals based upon the first clock signal and having a reduced frequency relative to an initial frequency of the first clock signal. The method further includes providing a feedback signal in addition to the modified clock signals, where the feedback signal also shares the reduced frequency, and detecting phase information concerning at least two of the feedback signal and the modified clock signals. The method also includes selectively inputting a signal related to one of the modified clock signals into a delay-locked loop (DLL) based on the phase information.

Further, the present invention in at least some other embodiments relates to a memory device that includes an input terminal that receives a first clock signal having an initial frequency, and a clock divider that generates a plurality of modified clock signals based at least in part upon the first clock signal, where each of the modified clock signals has a frequency that is reduced in comparison with the initial frequency. The memory device also includes a synchronous mirror delay (SMD), and a phase detector that is connected at least indirectly to each of the clock divider and the SMD, and that receives the modified clock signals and a delay signal. The phase detector determines timing characteristics based upon at least two of the delay signal and the modified clock signals, and it is determined based upon the timing characteristics which of the modified clock signals is provided to the SMD.

Additionally, the present invention in at least some further embodiments relates to a memory device that includes an input terminal that receives a first clock signal having an initial frequency, and a clock divider that generates a primary modified clock signal having a reduced frequency in comparison with the initial frequency, where the primary modified clock signal is generated at least indirectly based upon the first clock signal. The memory device further includes a delay-locked loop (DLL) that provides a feedback signal, and a phase detector that is connected at least indirectly to the DLL and to the clock divider, and that receives both the primary modified clock signal and the feedback signal. The memory device also includes a selector that is coupled at least indirectly to the clock divider, where the selector is controlled by the phase detector in order to select a further signal upon which the output signal is based at least indirectly. The phase detector determines timing characteristics based upon at least two of the primary modified clock signal, at least one additional modified clock signal, and the feedback signal. Additionally, the further signal is selected from among the primary modified clock signal and the at least one additional modified clock signal, and the output signal is determined based upon the timing characteristics.

In still additional embodiments, the present invention relates to electronic systems that include a processor and an integrated circuit in communication with the processor, where the integrated circuit further includes one or more memory devices such as the aforementioned memory devices.

Further, the present invention in at least some embodiments relates to circuitry configured to, or to a memory device having circuitry to, receive a first clock signal having an initial frequency, and provide a delay signal and a plurality of modified clock signals based upon the first clock signal, each of which has a reduced frequency relative to the initial frequency. The circuitry additionally is to compare at least one of the modified clock signals with the delay signal, select one of the modified clock signals based upon a result of the comparing, and generate an output signal, wherein the output signal in at least some circumstances is provided by a synchronous mirror delay (SMD). In some such embodiments, the memory device can be a semiconductor memory device, such as a DRAM or a SDRAM.

Additionally, the present invention in at least some embodiments relates to circuitry configured to, or to a memory device having circuitry to, receive a first clock signal having an initial frequency, and provide a plurality of modified clock signals based upon the first clock signal, each of which has a reduced frequency relative to the initial frequency. The circuitry is further to compare at least one of the modified clock signals with a feedback signal provided by way of a delay-locked loop (DLL), select one of the modified clock signals based upon a result of the comparing, and generate an output signal based at least indirectly upon the selected one of the modified clock signals. In some such embodiments, the memory device can be a semiconductor memory device, such as a DRAM or a SDRAM.

Also, the present invention in at least certain embodiments relates to a circuit adapted to provide an improved output clock signal based upon a received input clock signal, where the circuit receives the input clock signal, converts the input clock signal into a plurality of modified clock signals having a reduced frequency relative to an initial frequency of the input clock signal, performs a comparison of at least one of the modified clock signals with either a delay signal or a feedback signal to determine timing characteristics, and selects a signal from among the modified clock signals that in turn serves as a basis for the improved output clock signal, wherein the circuit at least one of includes and operates in conjunction with at least one of a synchronous mirror delay (SMD) and a delay-locked loop (DLL).

BRIEF DESCRIPTION OF THE DRAWINGS

The drawings illustrate the best mode presently contemplated for carrying out the invention.

In the drawings:

FIG. 5 is a chart illustrating the logic combinations of the signals in FIG. 2 based upon the timing characteristics of FIGS. 3 and 4;

FIG. 10 is a chart illustrating the logic combinations of the signals in FIG. 9 based upon the timing characteristics of FIG. 8;

DETAILED DESCRIPTION OF THE PREFERRED EMBODIMENT

Figure 1:
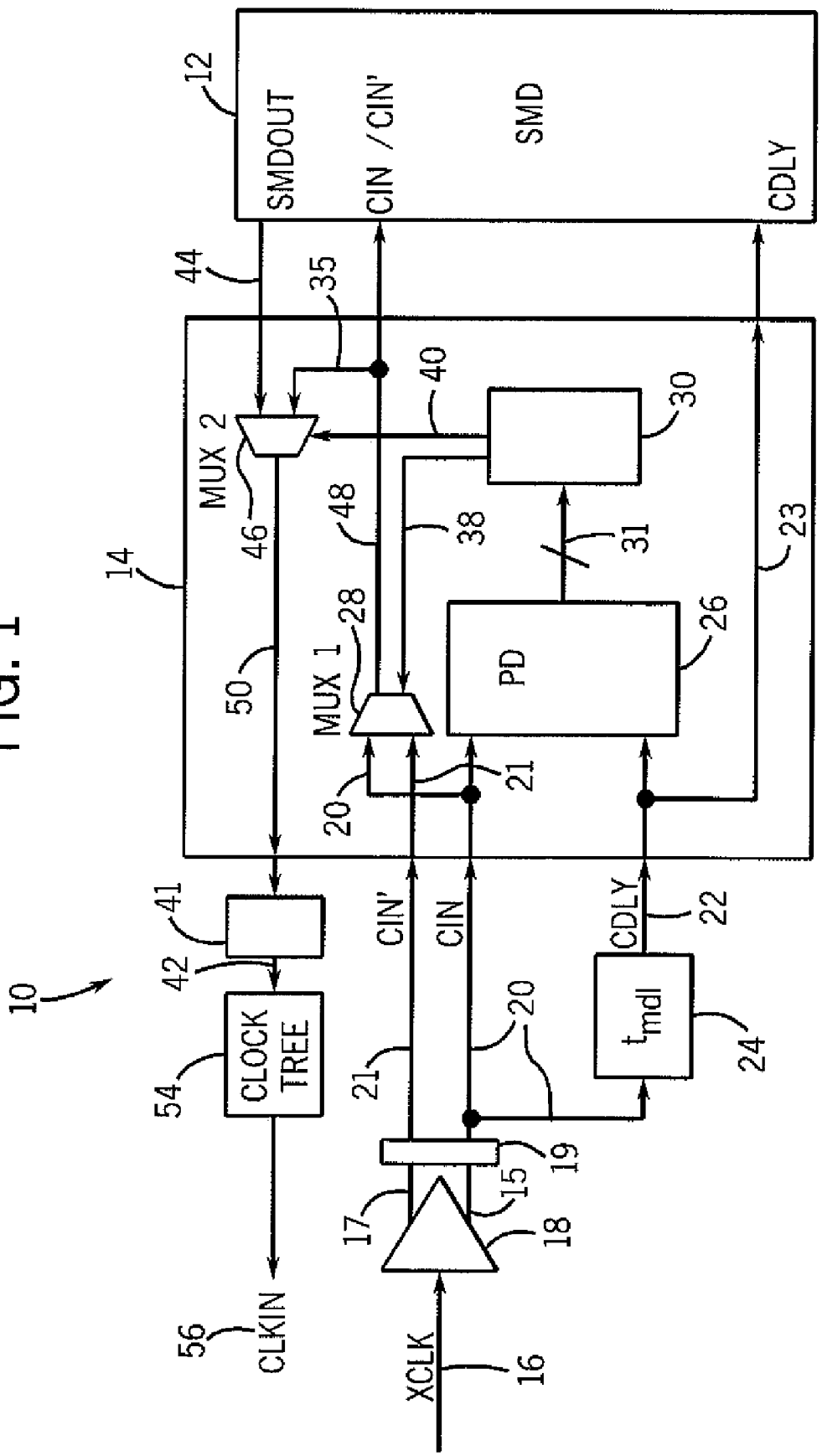
FIG. 1 is a block diagram of a synchronous mirror delay system with phase detection in accordance with one embodiment of the present invention.

Referring now to FIG. 1, a system in accordance with the present invention is shown generally by the numeral 10. The system 10 includes a synchronous mirror delay (S MD) circuit 12 and a phase detector control block 14. An external clock signal 16 is input into receiver and buffer 18.

The buffer 18 in turn outputs two signals, a clock input signal 15 and an inverted clock input signal 17, both of which are provided to a clock divider 19. The clock divider 19 divides the frequency of the clock input signal 15 and inverted clock input signal 17 so as to increase the period of those signals (both signals have the same frequency and the same period), so as to convert those signals into a modified clock input signal (CIN) 20 and a modified inverted clock input signal (CIN') 21, respectively, which can also respectively be referred to as a primary modified clock signal and an additional modified clock signal.

CIN 20 is further provided to a delay $t_{mdl}$ illustrated as block 24, which includes several delay components corresponding to delays associated with various components of the system 10 including an IO system delay component accounting for the buffer 18, a clock divider component accounting for the clock divider 19, and additional components corresponding to further clock tree and edge recovery elements discussed below. The output of the block 24 is a clock delay signal (CDLY) 22. Each of the CIN, CIN' and CDLY 20, 21 and 22 are fed into the phase detector control block 14. Additionally, the CDLY 22 is fed directly via a line 23 into the SMD 12.

The factor by which the frequency of the clock input signal 15 and inverted clock input signal 17 is divided, and by which the period of those signals is multiplied, can vary widely depending upon the embodiment. Often, but not necessarily, the factor is a simple, whole number such as a factor of 2, 4, 8, etc. For example, in the case of a clock divider using a factor of 2, where the frequency of the input signals 15, 17 is 800 MHz, the resulting CIN 20 and CIN' 21 output from the clock divider would each have a frequency of 400 MHz. Although not preferred, in alternate embodiments, it would also be possible to increase (rather than decrease) the frequency of the signals 15, 17 by a factor as well (in which case the clock divider would be a clock multiplier).

Application of the clock divider 19 in order to reduce the frequency of the clock signals has several benefits. As noted above, it can be difficult to distribute high-frequency clock signals across a large die without attenuation. Further, use of high-frequency clock signals necessitates the use of relatively high levels of power. In comparison, the lower-frequency clock signals provided by the clock divider are less susceptible to attenuation. Additionally, these lower-frequency clock signals can be transmitted with less power usage.

Phase detector control block 14 includes phase detector 26 and associated logical circuitry. A purpose of the system 10 is to take CIN 20 and CDLY 22 and, by defining certain characteristics and relationships about the timing of the signals, delineate specific conditions under which the circuit is operating, and direct the signal accordingly. Ultimately, the phase of the signals will determine whether CIN 20 or CIN' 21 is used as the input to the SMD 12, or whether the SMD is bypassed altogether. Although a specific logic arrangement is shown, it is contemplated that any suitable control logic can be used to define the conditions of the signals and select them accordingly.

Figure 2:
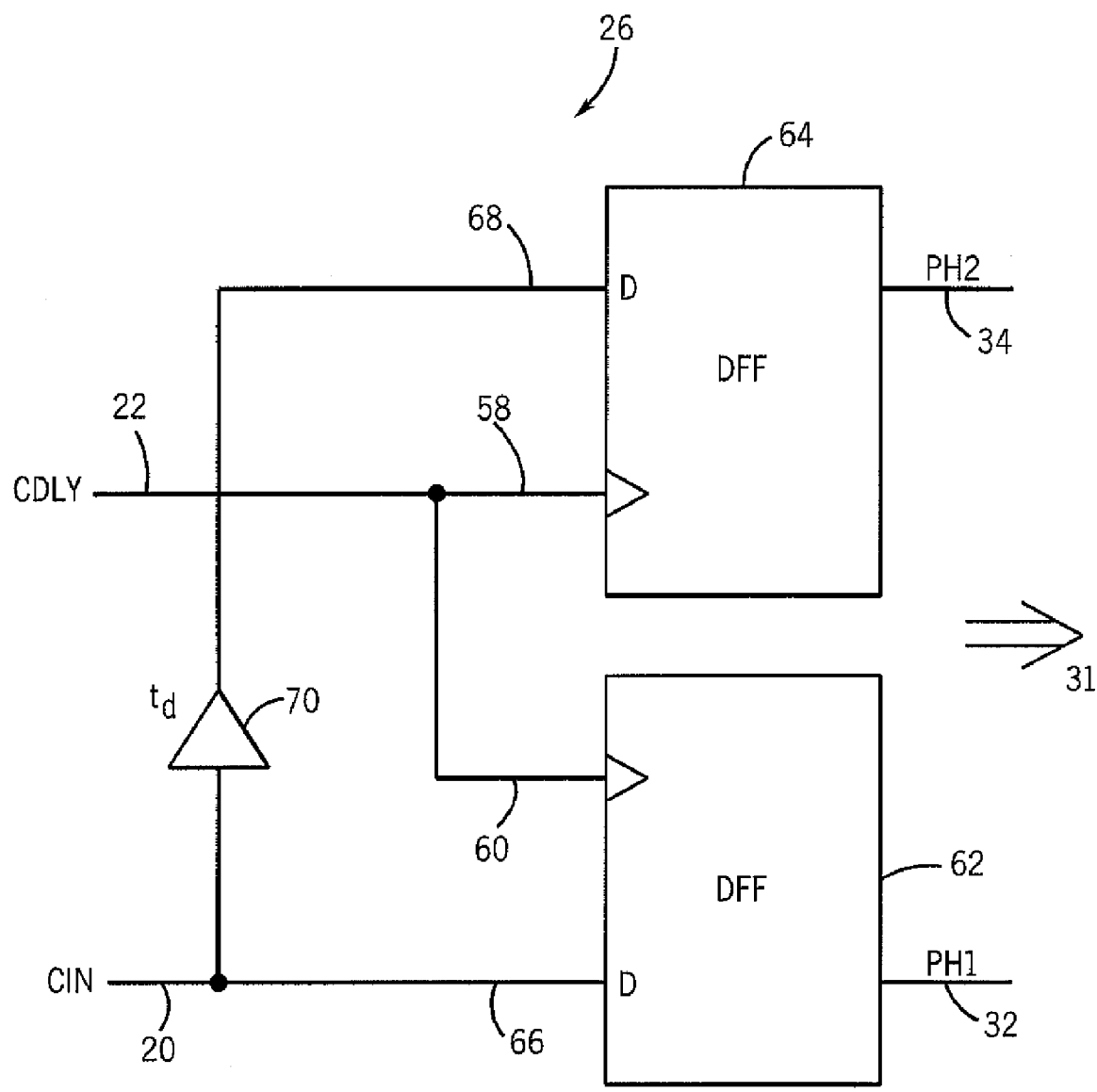
FIG. 2 is a circuit diagram illustrating the phase detector of the system of FIG. 1 in accordance with one aspect of the present invention.

Associated with the phase detector 26 is an input multiplexer 28 that is used as an input selection multiplexer, that is, to determine which selection input (CIN or CIN'), based on the difference between CIN 20 and CDLY 22, to send to the SMD 12 via a line 48. The outputs (collectively 31) of phase detector 26, which will be described in further detail with respect to FIG. 2, are fed into phase detection circuitry control block 30. Circuitry control block 30 can be, for example, a decoder, although any suitable logic is contemplated. Outputs 38 and 40 of circuitry control block 30 are used to select the outputs for multiplexer 28 as well as an output multiplexer 46, respectively.

Based on the output (signal) 38 from circuitry control block 30, input multiplexer 28 will select either CIN 20 or CIN' 21 to be placed on the line 48. Additionally, the output multiplexer 46 is used in combination with the circuitry control block 30 to select which signal is to be put on an output line 50. The line 48, on which is placed either CIN 20 or CIN' 21, is directed into the SMD 12. The line 48 is also directed via a connection 35 to an input of the output multiplexer 46 (which is an output selection multiplexer).

As is known in the art, the SMD 12 includes a measurement delay line composed of a plurality of serially cascaded delay elements (not shown). Each delay stage is a delay element with control gates. An output of the measurement delay line is used as the input to a variable delay line. The variable delay line is also a plurality of serially connected delay elements (not shown). The output of the variable delay line of the SMD 12 is output signal SMDOUT 44. Output signal SMDOUT 44 is provided as an input to the output multiplexer 46.

In some circumstances, it is desired to entirely bypass SMD 12 and, in such a case, circuitry control block 30 will send a control signal 40 selecting the signal on connection 35 rather than output signal SMDOUT 44 as the signal to be output on output line 50 of output multiplexer 46. As a result, the signal provided on line 48 (either CIN 20 or CIN' 21) is used as the input for output multiplexer 46. In other cases, the circuitry control block 30 sends the control signal 40 so as to select output signal SMDOUT 44 from SMD 12.

Given the selection by the output multiplexer 46 of one of either the signal on connection 35 or the output signal SMDOUT 44 as the output signal to be provided on output line 50, that output signal is used as the input to an edge recovery element 41 (or, alternatively, a phase generation element or simply a phase generator). The edge recovery element 41, which can be implemented using digital or analog circuitry (or software) as known in the art, is configured to recover edge information pertaining to one or more of CIN 20, CIN' 21, and/or CDLY 22 that are provided to the SMD 12 by way of lines 48 and 23. This edge information, particularly falling edge information, can be obscured or lost due to the introduction and operation of the clock divider 19 that reduces the frequency of these signals as discussed above. In at least some embodiments, the edge recovery element 41 recovers the edge information by generating a quadrature-shifted clock that is 90 degrees out of phase with a reference clock. As a result of the recovery of the edge information, the edge recovery element 41 makes duty cycle correction possible.

The output from the edge recovery element 41 is in turn provided, by way of a signal 42, to a clock tree 54. As is known, a clock tree such as clock tree 54 is a circuit used for distributing a local clock signal. A clock tree can include an internal buffer in order to amplify, buffer and delay the signal in order to form an internal clock signal such as internal clock signal CLKIN 56, which is shown to be provided by clock tree 54. Although not shown, it is further contemplated that an inverter can also be placed before the clock tree 54 in order to invert the clock signal if desired. In this manner, internal clock signal CLKIN 56 is synchronized to external clock signal 16, where the CLKIN 56 is at a frequency that is half that of the external clock signal 16.

Because the clock divider 19 reduces the frequency of the external clock signal 16 by a factor of two, the SMDOUT signal 44 can be a lower speed signal that it otherwise might be. Consequently, the output signal on output line 50 can be transmitted a relatively long distance despite the use of less power than might otherwise be the case, such that the edge recovery element 41 can be physically relatively far from the phase detector control block 14/multiplexer 46 than might otherwise be the case. In contrast, typically, the edge recovery element 41 is in close physical proximity to the clock tree 54. As mentioned above, the block 24 representing the delay $t_{mdl}$ includes delay components corresponding to the delays associated with edge recovery element 41 and the clock tree 54.

Referring now to FIG. 2, phase detector 26 is described in more detail. Phase detector 26 receives CIN 20 and CDLY 22, and those signals are provided as inputs into registers 62 and 64. In the embodiment shown in FIG. 2, CDLY is used as clock inputs 58 and 60 for the registers 64 and 62, respectively. More particularly, in the embodiment shown, D flip-flops are employed as registers 62 and 64, and CDLY 22 is input into the clock inputs of those D flip-flops. Further, CIN 20 is input as the D inputs 66 and 68 of D flip-flops 62 and 64, respectively. Input 68 is delayed from CIN 20 by a time delay period ($t_d$) 70, which is representative of the delay per stage, and therefore there is a delay between input signals 66 and 68 (e.g., by the period $t_d$).

As shown in FIG. 2, the flip-flops 62 and 64 respectively output signals 32 and 34, which are shown also as "PH1" and "PH2" signals, respectively, and which collectively can be grouped as the above-discussed output signals 31. The logical levels, e.g., a logical 1 or a logical 0, of signals 32 and 34 determine the conditions under which CIN 20 and CDLY 22 are operating. The signal conditions are based on their individual timing characteristics. Although D flip-flops are shown in FIG. 2, it is contemplated that other logic device(s) suitable for the application can also be employed.

Figure 3:
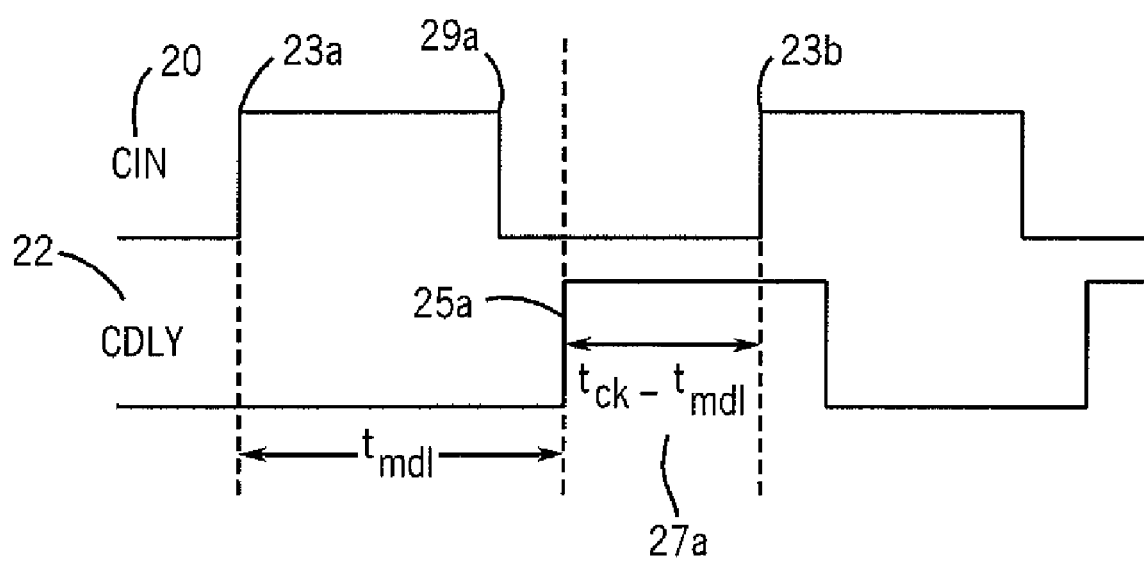
FIG. 3 is a signal timing diagram showing the timing of a clock input signal and a clock delay signal of the system of FIG. 1 in accordance with one aspect of the present invention.

Referring now to FIG. 3, a clock diagram is provided illustrating one possible combination of timing characteristics of CIN 20 and CDLY 22. As shown, CIN 20 fires first, and the characteristic delay $t_{mdl}$ represented by block 24 (which is the delay of the IO model/buffer, the clock divider, the clock tree and the edge recovery element) is measured from a rising edge 23a of CIN to a rising edge 25a of CDLY 22. The entire period of CIN 20, that is the measurement of the rising edge 23a to the next rising edge 23b, is defined as the clock period or $t_{ck}$ of the modified clock input signal CIN 20, which is the same as the period of the modified inverted clock input signal CIN' 21 and the clock delay signal CDLY 22, and double the period of the external clock signal 16.

Therefore, the time defined from the rising edge 25a of CDLY 22 to the next rising edge 23b of CIN 20 defines a delay, $t_{delay}$ 27a, which may be defined by $t_{ck}$ minus $t_{mdl}$. This series of timing characteristics would occur when CDLY 22 fires after a first falling edge 29a of CIN 20. This sampling of CIN from rising edge to rising edge requires a given number of delay stages to accomplish, where the total delay of these delay stages is $t_{delay}$, which is less than half of $t_{ck}$, Referring now to FIG. 4, an alternate timing diagram is shown for CIN 20 and CDLY 22. These timing characteristics would occur when a rising edge 25b of CDLY 22 occurred prior to a falling edge 29b of CIN 20. Again, the delay between the firing at the rising edge 23b of CIN 20 and rising edge 25b of CDLY 22 defines the period of delay $t_{mdl}$ corresponding to the 10 model/buffer, clock divider, clock tree and edge recovery element. Because the period of time from rising edge 23b to falling edge 29b represents half of the clock period $t_{ck}$, that portion of the signal may be represented by $t_{ck}/2$. Therefore, that distance minus the delay period for the model $t_{mdl}$ results in a delay 27b, in this case equaling $t_{ck}/2$ minus $t_{mdl}$.

Further, if the phase detector 26 analyzes when the rising edge of CDLY 22 occurs with respect to the falling edge of CIN 20, a distinction can be made with respect to the timing characteristics of the individual signals 20 and 22. Since the total delay required from the SMD for synchronization is reduced from ($t_{ck}$ minus $t_{mdl}$) to ($t_{ck}/2$ minus $t_{mdl}$), where $t_{mdl}$ is less than $t_{ck}/2$, more than half of the delay stages can be saved with this arrangement. That is, the present embodiment takes advantage of the ability to sample from a rising edge 23b to falling edge 29b, resulting in fewer delay stages in the SMD 12.

Figure 4:
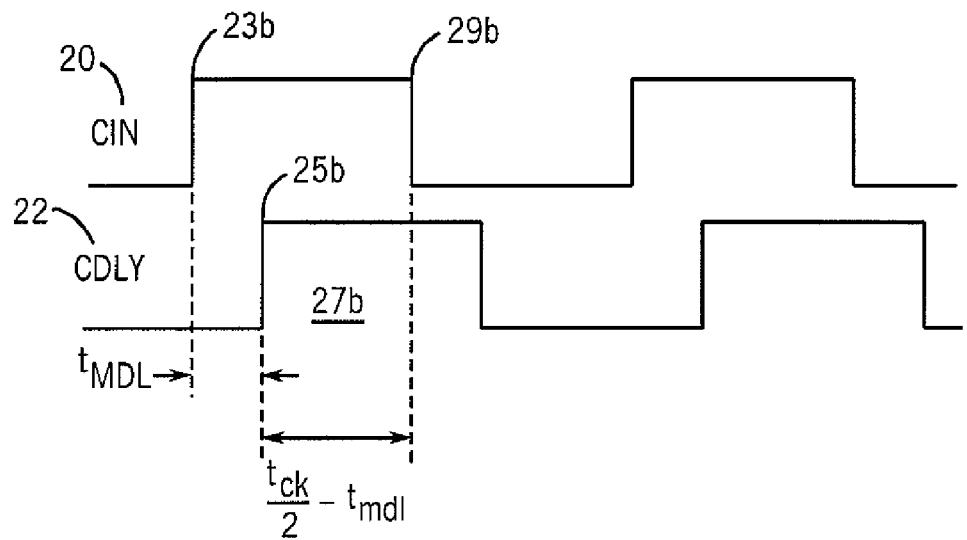
FIG. 4 is a signal timing diagram showing additional timing of a clock input signal and a clock delay signal of the system of FIG. 1 in accordance with one aspect of the present invention.
Figure 4A:
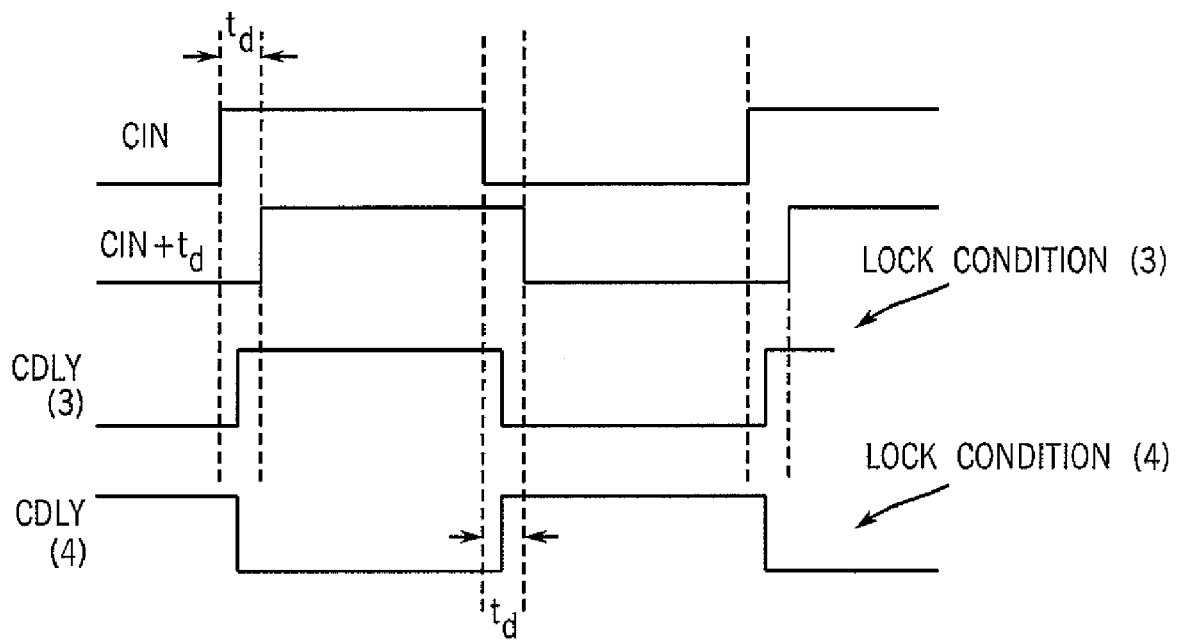
FIG. 4a is a signal timing diagram showing further timing of a clock input signal and a clock delay signal of the system of FIG. 1, in this example under lock conditions, in accordance with one aspect of the present invention.

Referring now to FIG. 4a, the timing diagram is shown illustrating the lock conditions. CIN is shown as well as CIN plus $t_d$, where $t_d$ represents the delay between the two signals. In lock condition 3, CDLY is shown rising between the rising of CIN and CIN plus $t_d$, and falling between the falling of CIN and CIN plus $t_d$, respectively. Under this circumstance, a lock condition exists and the synchronous mirror delay (e.g., SMD 12) is bypassed. Under lock condition 4, CDLY rises between the falling edge of CIN and the falling edge of CIN plus $t_d$. Also, CDLY falls between the rising edge of CIN and the rising edge of CIN plus $t_d$. Again, under this circumstance, a lock condition exists and again the SMD is bypassed.

Referring now to FIG. 5, the four possible combinations of the logical levels of the PH1 signal and the PH2 signal are illustrated, where the PH1 signal and the PH2 signal as discussed above respectively are the signals provided as the signal 32 and the signal 34. Based on the logical levels of each of these signals, the condition of the signals can be determined as follows.

$$t_{mdl} > t_{ck}/2 \qquad \text{Condition (1)}$$

where, again, $t_{ck}$ is the clock period of the modified clock input signal CIN 20, which is equal to the clock period of the internal clock signal CLKIN 56 and double that of the external clock signal 16. For condition (1), the effective delay length in the SMD is equal to $t_{ck}-t_{mdl}$. When locking, $t_{lock}=d_{in}+t_{mdl}+(t_{ck}-t_{mdl})$(measured)$+(t_{ck}-t_{mdl})$(variable)$+d_{out}=2t_{ck}+d_{in}+d_{out}-t_{mdl}\approx 2t_{ck}$, where $d_{in}$ and $d_{out}$ are IO intrinsic delays on which $t_{mdl}$ is represented or modeled.

This is the conventional equation to calculate the lock time of the SMD, which is two clock cycles.

$$t_{mdl} < t_{ck}/2 \qquad \text{Condition (2)}$$

Under this condition, a mux is used to select a different phase of CIN to feed in the SMD and the effective delay length is equal to $t_{ck}/2-t_{mdl}$. Again, $t_{lock}=d_{in}+t_{mdl}+(t_{ck}/2-t_{mdl})+(t_{ck}/2-t_{mdl})+d_{out}=t_{ck}+d_{in}+d_{out}-t_{mdl}\approx t_{ck}$. The lock time is decreased to only one clock cycle. From the previous example, using an internal clock period $t_{ck}$ of 5 ns (which, due to the "divide-by-two" clock divider 19, corresponds to an external clock period $t_{cke}$ of 2.5 ns), $$N_{worst} = \frac{5\text{ns}/2 - 1\text{ns}}{110\text{ps}} \approx 14 \text{ stages}$$

compared to 36 stages without the invention.

Condition (3):

When $t_{mdl}=t_{ck}$, the phase detector would declare a lock condition and the CIN is output directly without even passing into the SMD. The SMD can be disabled to save power.

Condition (4):

When $t_{mdl}=t_{ck}/2$, the CIN is inverted and the SMD can be disabled to save power.

It is contemplated that the present arrangement will reduce the effective delay elements used in the SMD, as a function of the signals being found under the condition 2, saving both silicon area and power in the memory device, which is a significant goal.

For conditions (2) and (4), if there is a severe duty cycle distortion of the external clock signal 16 after the clock divider 19, the outputs (CIN, CIN') will have a 50% duty cycle. In accordance with the present embodiment, the edge recovery (or, alternatively, phase generation) element 41 serves to correct duty cycle distortion along the path, such that any large skew at the output will generally not occur.

Figure 6:
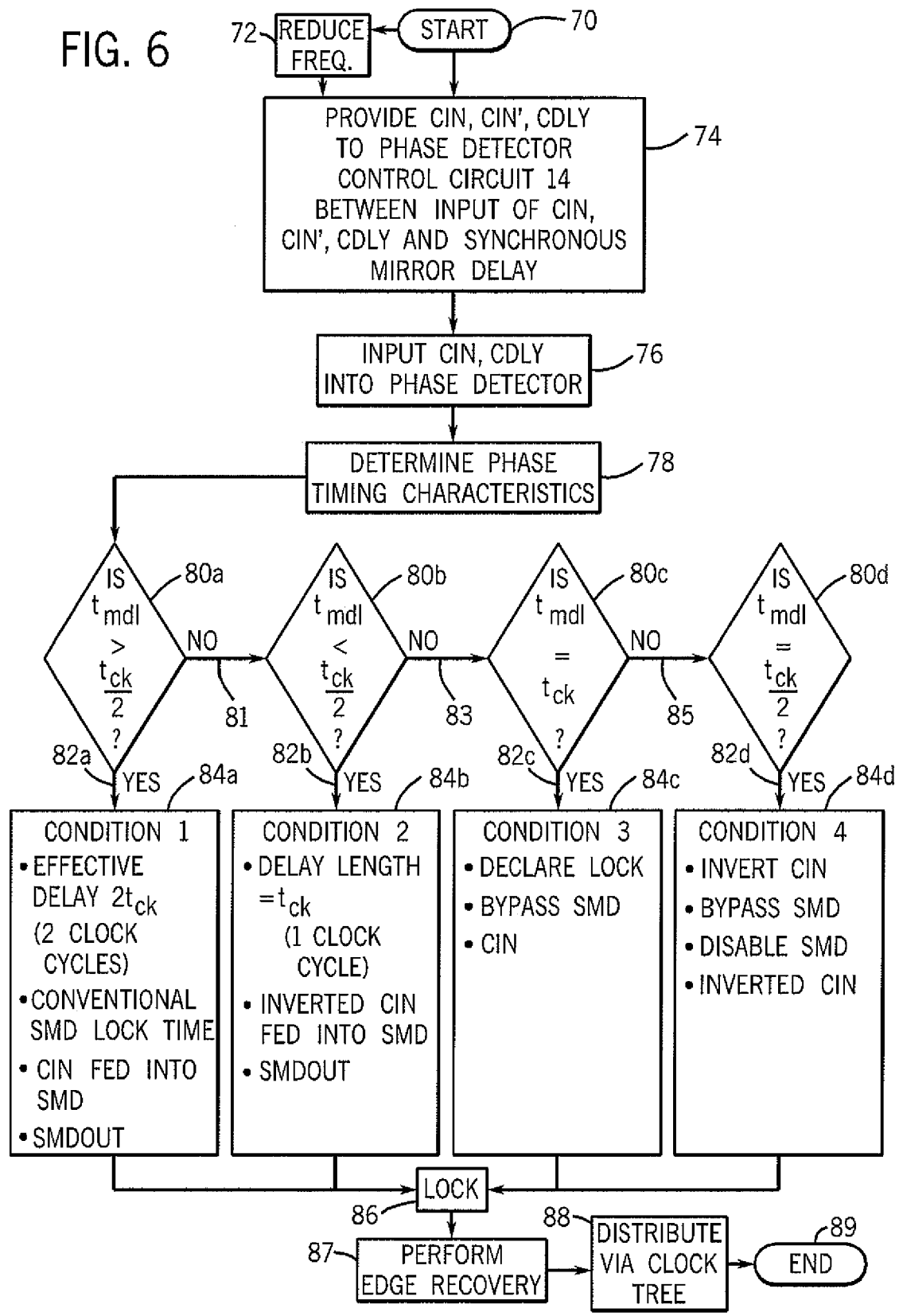
FIG. 6 is a flowchart illustrating a method of operation of the system of FIG. 1 in accordance with one aspect of the present invention.

Referring now to FIG. 6, a flowchart illustrating a methodology associated with the present invention is disclosed, where among other things the present invention in at least some embodiments is intended to reduce the number of delay stages and at the same time avoid excessive attenuation, power dissipation, and duty-cycle distortion. After starting at block 70, at a step 72 the frequency associated with the clock input signal and inverted clock input signal (both of which are derived from the external clock signal) is reduced by the clock divider so as to generate the CIN and CIN'.

Then, CIN, CIN' and CDLY (each having this reduced frequency) are provided in step 74 to the phase detector interposed between the SMD and the CIN and CDLY signals. As discussed above, CDLY is delayed by the delays associated with the IO model/buffer, clock divider, clock tree and edge recovery element. Next, at step 76, both CIN and CDLY are input into the phase detector. Subsequent to the inputting of these signals, the condition or phase of the timing signals is determined at step 78, where the determination is based on the timing characteristics and relationships of CIN to CDLY.

As additionally shown in FIG. 6, the determination of the condition/phase of the timing signals at step 78 involves a series of four decisions 80a through 80d used to determine the relationship of the particular timing characteristics $t_{mdl}$ versus $t_{ck}$. Although the series of decisions are shown to be made in a serial fashion, that is, 80a prior to 80b and so on, these operations could also be rearranged to run in parallel, so long as the determinations are made. In decision 80a, it is determined whether $t_{mdl}$ is greater than $t_{ck}/2$. If so, at 82a, a first condition 84a is triggered in which the lock time is equal to two clock cycles, which is the conventional synchronous mirror delay lock time. In a conventional manner, CIN is then fed into the synchronous mirror delay. The output signal SMDOUT is used as the "locked" output as shown in a step 86, and is output on line 50 to the edge recovery element 41 at a step 87 and subsequently to the clock tree 54 at a step 88 prior to completion of the method at a step 89.

If the first condition is not satisfied, as indicated by 81, it is determined whether $t_{mdl}$ is less than $t_{ck}/2$ in decision 80b. If so, at 82b, a second condition 84b is implicated in which the lock time is equal to approximately one clock cycle, or approximately half of the conventional synchronous mirror delay lock time. CIN is then inverted and fed into the synchronous mirror delay. The output signal SMDOUT is used as the "locked" output as shown in step 86, and is output on line 50 to the edge recovery element 41 at step 87 and subsequently to the clock tree 54 at step 88 prior to completion of the method at step 89.

If the second condition is not satisfied, as indicated by 83, it is determined whether $t_{mdl}$ is equal to $t_{ck}$ in decision 80c. If so, at 82c, a third condition 84c is implicated, and lock has already occurred so a lock is declared (as confirmed by step 86) and the synchronous mirror delay is bypassed. CIN is then input directly into the edge recovery element 41 at step 87 and subsequently into the clock tree 54 at step 88 for internal production of the clock, prior to completion of the method at step 89.

If none of these conditions are true, as indicated by 85, it is determined whether $t_{mdl}$ is equal to $t_{ck}/2$ in decision 80d. If so, at 82d, a fourth condition 84d is implicated and it is merely necessary to invert the CIN signal or use an inverted CIN as the output on line 50. Again, since there is no need to further delay, the synchronous mirror delay is bypassed and, in a preferred embodiment can be disabled in order to save power. CIN' is then input into the edge recovery element 41 at step 87 and subsequently into the clock tree 54 at step 88 to distribute the internal clock signal, prior to completion of the method at step 89. The result of all four conditions 84a-d is that lock 86 occurs with an overall reduction in delay stages, which is the purpose of the circuit while maintaining the desired operating range.

Although FIGS. 1-6 show the system 10 as employing a phase detector control circuit 14 that receives and operates based upon three signals (namely, CIN, CIN' and CDLY), FIG. 1 is also intended to be representative of a variety of alternate embodiments of the system in which more than three signals are provided. In particular, while in each of these alternate embodiments CIN and CDLY are still provided to the phase detector control block 14 (or to a phase detector control block similar thereto, as discussed further below with respect to FIG. 7), additionally CIN' can be modified in its timing and/or replaced with multiple signals, in which case "CIN'" can be understood to encompass such signals.

The provision of these different and/or multiple signals as CIN' to the phase detector control block, and particularly the provision of multiple signals as CIN', allows the phase detector control block to make finer comparisons of those signals with the CDLY signal as discussed with reference to FIGS. 3-4a. Consequently, the phase detector control block is able to more finely control the delays introduced by the SMD 12 when the output of the SMD is provided on the output line 50 of the phase detector control block, as well as able to better identify situations in which the SMD can be bypassed altogether. In particular, when CIN'encompasses more than one signal, the phase detector control block is able to identify more than simply the two lock conditions in which the SMD can be bypassed altogether discussed above with reference to FIG. 4a.

Figure 7:
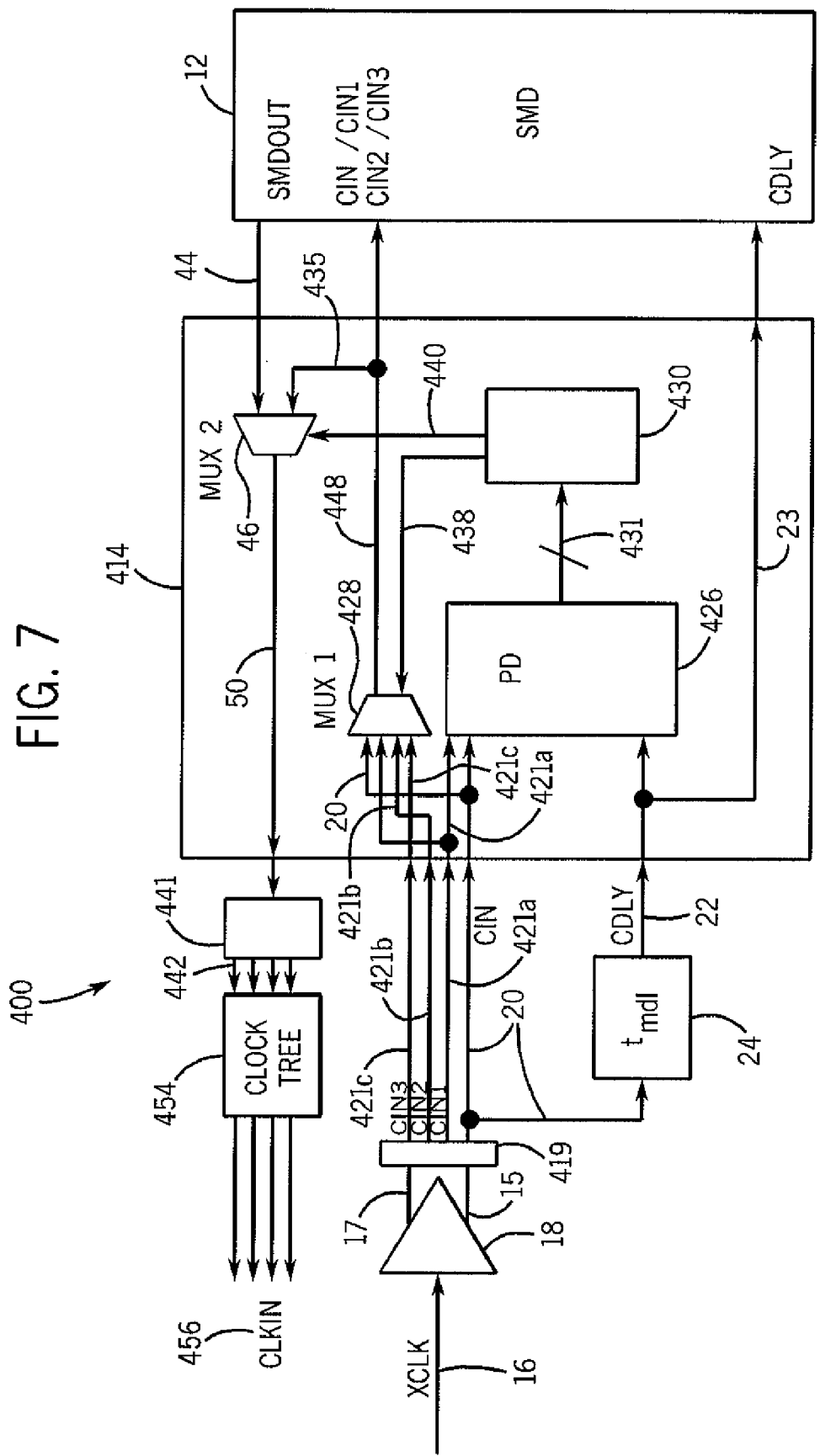
FIG. 7 is a block diagram of a synchronous mirror delay with phase detection in accordance with another embodiment of the present invention differing from that of FIG. 1.

Turning to FIG. 7, an alternate embodiment of the system 10 of FIG. 1 is shown as system 400. The system 400 is similar to that of FIG. 1 insofar as the system includes the buffer 18 that receives the external clock signal 16 and in turn produces the clock input signal 15 and the inverted clock input signal 17. As in the case of the FIG. 1 embodiment, the clock input signal 15 and the inverted clock input signal 17 are received and processed by a clock divider 419 that decreases the frequency of those signals by a particular factor (e.g., by 2). The clock divider 419 outputs the modified clock input signal (CIN) 20 that has a reduced frequency relative to the signals 15, 17 and that is provided to the block 24 constituting the delay $t_{mdl}$, which in turn provides the signal CDLY 22 to a phase detector control block 414.

Further, as in the case of the FIG. 1 embodiment, the system 400 includes the SMD 12 that is in communication with the phase detector control block 414 and receives the signal CDLY 22 by way of the line 23 along with an additional signal on a line 448 (as discussed in further detail below). Also, the phase detector control block 414 includes the output multiplexer 46 that, based upon a control signal (in this case an output 440) determines whether the signal SMDOUT 44 from the SMD 12 or another signal from an input multiplexer (in this case an input multiplexer 428) is output on the line 50 to an edge recovery element 441.

Figure 8:
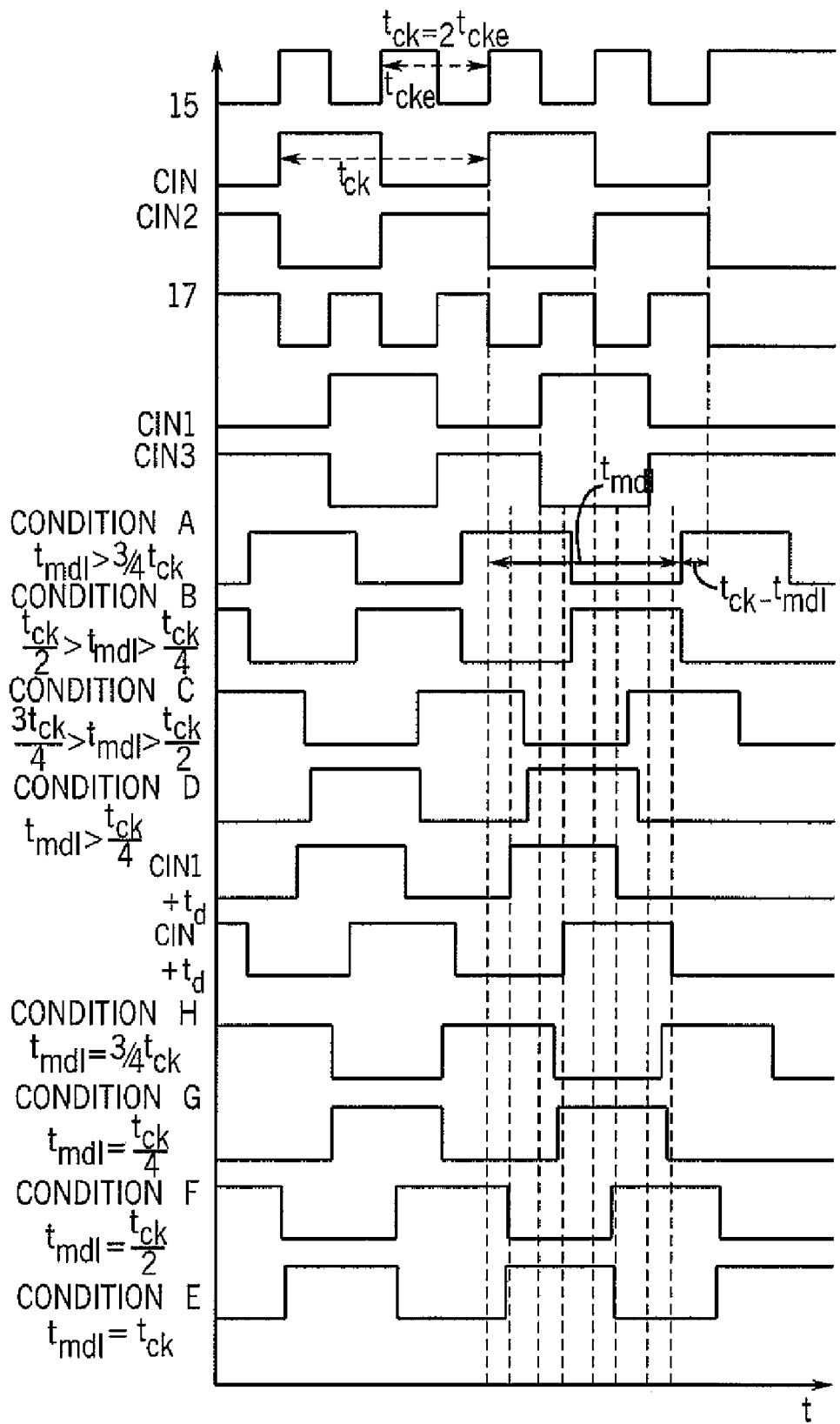
FIG. 8 is a signal timing diagram showing the timing of a clock input signal and related signals including a clock delay signal of the system of FIG. 7 in accordance with one aspect of the present invention.

However, in contrast to the embodiment of FIG. 1, the clock divider 419 generates not merely the CIN 20 and an inverted version of that signal (in this case shown as a signal CIN2 labeled with reference numeral 421b), but also generates additional modified clock input signals shown as CIN1 421a and CIN3 421c. As shown in FIG. 8, CIN 20 and CIN2 421b are derived from the positive edges of the clock input signal 15, while CIN1 421a and CIN3 421c are derived from the positive edges of the inverted clock input signal 17. Each of the signals CIN 20 and CIN1 421a, CIN2 421b and CIN3 421c are provided to the phase detector control block 414. Thus, the phase detector control block 414 receives five signals (counting CDLY 22) rather than merely three signals as in FIG. 1.

Further, as shown in FIG. 7, the phase detector control block 414 utilizes all five of the signals it receives in a manner similar to, but not identical to, the manner of FIG. 1. As shown, the signals CIN 20 and CIN1 421a are both provided to a phase detector 426, along with CD LY 22. Additionally, all of the signals CIN 20 and CIN1, CIN2 and CIN3 421a-c are provided to the input multiplexer 428 that is used as an input selection multiplexer to determine which selection input (CIN, CIN1, CIN2 or CIN3) should be sent to the SMD 12 via a line 448.

Based upon the relative differences between the signal CDLY 22 and the signals CIN 20 and CIN1, CIN2 and CIN3 421a-c (where CIN2 and CIN3 are determined by the phase detector based upon CIN and CIN1), the phase detector provides outputs 32, 34, 432 and 434 (collectively 431) that are fed into a phase detection circuitry control block 430. As discussed above with reference to the control block 30, the control block 430 could be a decoder, for example, or take some other suitable form. The circuitry control block 30 determines, based upon the outputs 431, outputs 438 and 440 that are respectively provided to the multiplexer 428 and the multiplexer 46, respectively.

Figure 9:
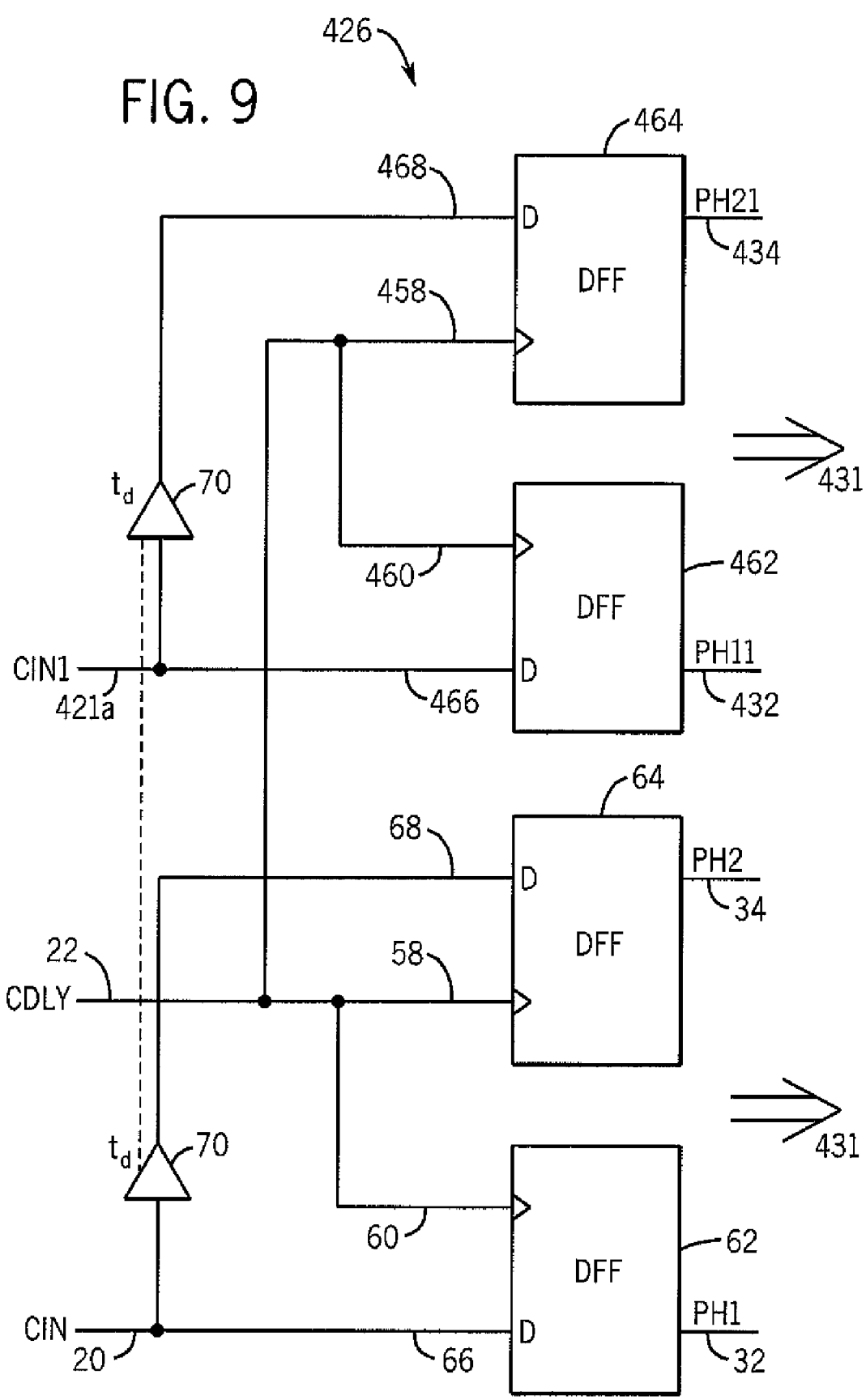
FIG. 9 is a circuit diagram illustrating the phase detector of the system of FIG. 7 in accordance with one aspect of the present invention.

Referring now to FIG. 9, one exemplary embodiment of the phase detector 426 is described in more detail. The phase detector 426 receives CIN 20, CIN 421a and CDLY 22 as shown. As in the case of the phase detector 26 discussed above with respect to FIG. 2, the phase detector 426 includes the registers 62 and 64, and CDLY 22 is input into the clock inputs 60 and 58 of those two registers, respectively. Additionally, CIN 20 is input as the D inputs 66 and 68 of the registers 62 and 64, respectively, with the input 68 being delayed from CIN 20 by the time delay period ($t_d$) 70, which is representative of the delay per stage (such that there is a delay between input signals 66 and 68, e.g., by the period $t_d$). The registers 62 and 64 respectively output signals 32 and 34, which are shown also as "PH1" and "PH2" signals, respectively.

Further, in contrast to the phase detector 26, the phase detector 426 also includes two additional registers 462 and 464. Each of those registers receives, at its respective clock inputs 460 and 458, CDLY 22. Additionally, the register 462 receives at its D input 466 the signal CIN1 421a, while the register 464 receives at its D input 468 the signal CIN1 421a delayed by the time delay period ($t_d$) 70. Although in FIG. 9 the same time delay period 70 is used in delaying each of CIN 20 and CIN1 421a, in alternate embodiments different time delay periods could be used for the purpose of delaying the different signals. The registers 462 and 464 respectively output signals 432 and 434, which are shown also as "PH11" and "PH21" signals, respectively.

Figure 11A:
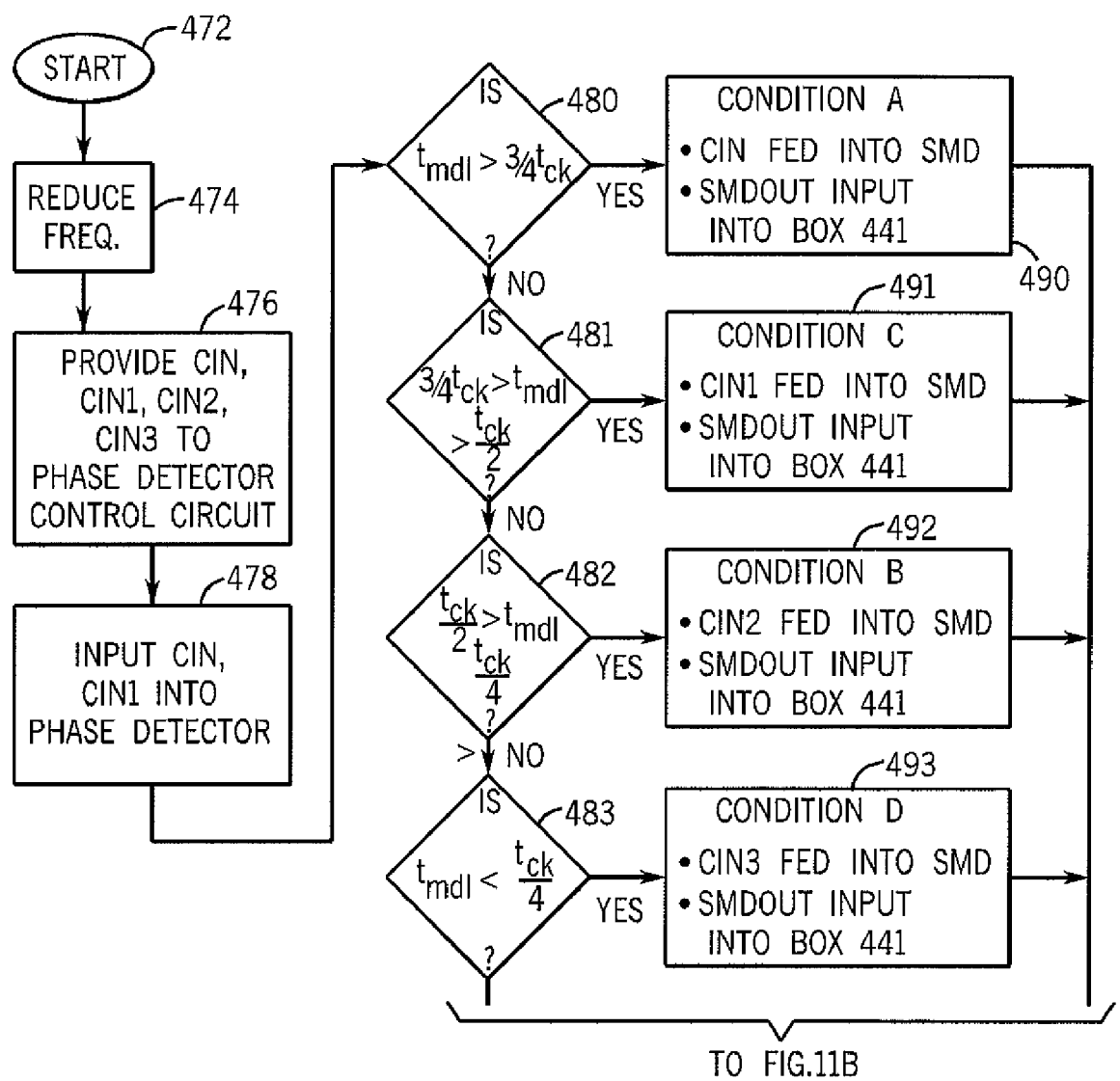
FIGS. 11A-11B is a flowchart illustrating a method of operation of the system of FIG. 7 in accordance with one aspect of the present invention.
Figure 11B:
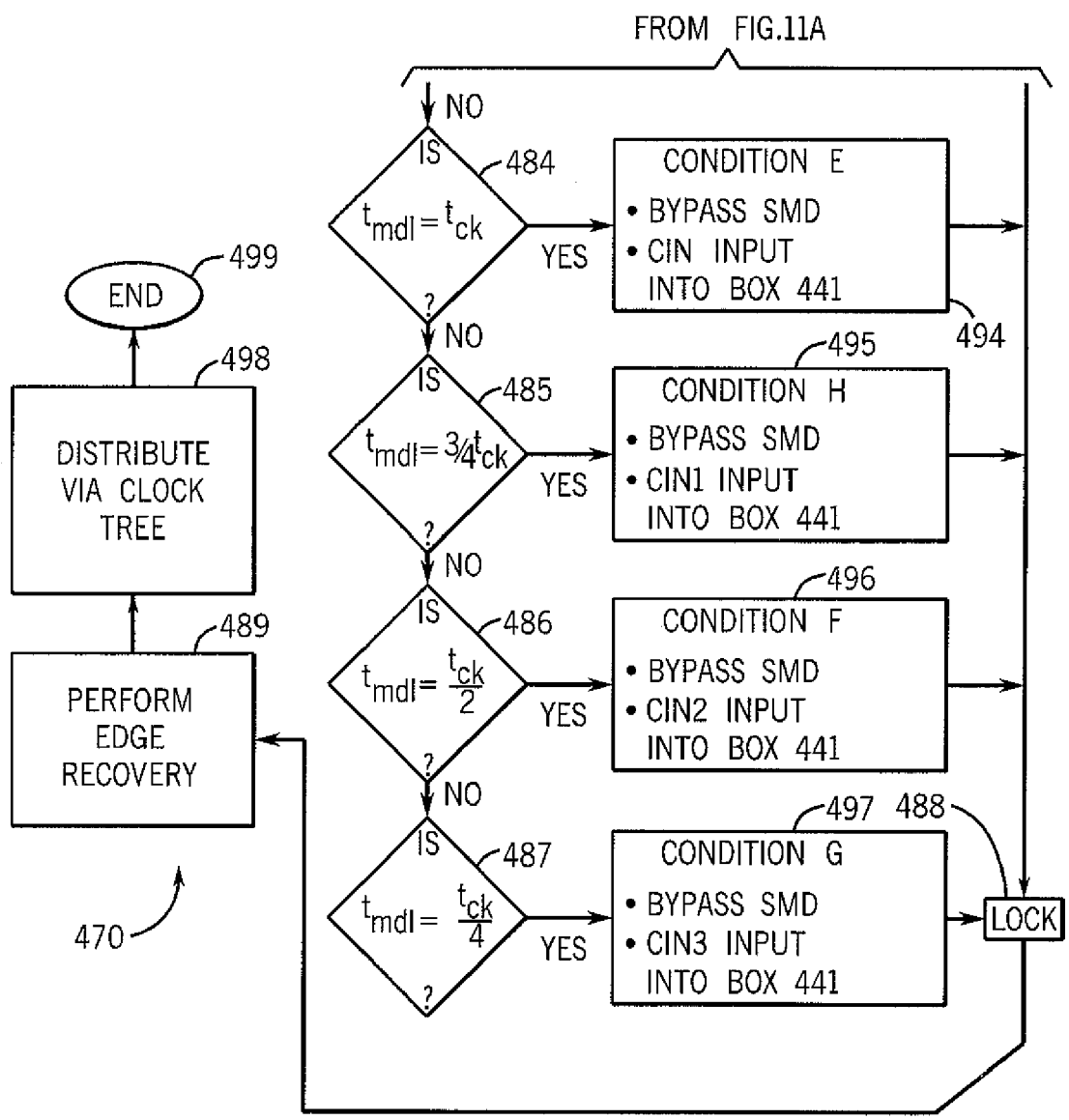

Referring to FIGS. 10-11A-B as well as to FIG. 8, the phase detection circuitry control block 430 determines the outputs 438 and 440 based upon the signals 431 (that is, PH1, PH2, PH11 and PH21) depending upon the relative timing characteristics of CDLY 22 and CIN 20 (as well as CIN1, CIN2 and CIN3 that are determined in relation to CIN 20). In particular, the signals 431 are capable of indicating eight different timing conditions A-H shown in FIGS. 8, 10 11A-B. As shown, conditions E-H represent four different locked conditions that are respectively met if the rising (or, as shown, falling) edges of CDLY 22 occur within close proximity of the rising edges of one of CIN, CIN1, CIN2 and CIN3, namely, whether the rising edges of CDLY fall within the time period 70 subsequent to the rising edges of CIN, CIN1, CIN2 and CIN3.

FIG. 8 in particular shows that condition E occurs when the rising/falling edges of CDLY 22 occur within the time period 70 subsequent to the rising edges of CIN. Likewise, condition F occurs when the rising/falling edges of CDLY 22 occur within the time period 70 subsequent to the rising edges of CIN1, condition G occurs when the rising/falling edges of CDLY occur within the time period 70 subsequent to the rising edges of CIN2, and condition H occurs when the rising/falling edges of CDLY occur within the time period 70 subsequent to the rising edges of CIN3.

As for conditions A, B, C and D, these conditions respectively occur when the rising/falling edges of CDLY 22 are not within the time periods 70 subsequent to the rising edges of CIN, CIN1, CIN2 and CIN3, but rather are between those time periods. FIG. 10 in particular shows that conditions A, B, C and D respectively occur when the rising/falling edges of CDLY 22 are timed such that the conditions $t_{mdi} > 3t_{ck}/4$, $t_{ck}/2 > t_{mdi} > t_{ck}/4$, $3t_{ck}/4 > t_{mdi} > t_{ck}/2$, and $t_{mdi} < t_{ck}/4$ are met, respectively, and yet the rising/falling edges of CDLY do not occur within the time periods 70 subsequent to the rising edges of CIN, CIN1, CIN2 and CIN3.

FIG. 10 further shows that the signals 431 produced by the phase detector 426, as a result of the circuitry shown in FIG. 9, vary depending upon which of the conditions A-H is being met. In particular, when condition A is being met, all of PH1, PH2, PH11 and PH21 take on a value of zero, and when condition B is being met, all of those signals take on a value of one. Further, when condition C is being met, PH1 and PH2 take on values of zero and PH11 and PH21 take on values of one, while when condition D is being met, PH1 and PH2 take on values of one and PH11 and PH21 take on values of zero. Additionally, when condition E is being met, PH1 takes on a value of 1 while PH2 takes on a value of zero, when condition F is being met, PH2 takes on a value of 1 while PH1 takes on a value of zero, when condition G is being met, PH11 takes on a value of 1 while PH21 takes on a value of zero, and when condition H is being met, PH21 takes on a value of 1 while PH11 takes on a value of zero.

Depending upon the values of the signals 431, the phase detection circuitry control block 430 determines the outputs 438 and 440 as shown in steps 490-497 of a flow chart 470 of FIGS. 11A-B, which like FIG. 6 is intended to represent a methodology associated with the operation of the system 400 of FIG. 7. As shown in FIGS. 11A-B, after starting at a step 472, the frequency of the signals 17,15 generated in response to the external clock signal 16 is reduced by the clock divider 419 as indicated by a step 474. Subsequently, at a step 476, the CIN, CIN1, CIN2 and CIN3 signals are provided from the clock divider 419 to the phase detector control block 414 and, more particularly at a step 478, the CIN and CIN1 signals are provided into the phase detector 26.

As indicated by steps 480-487, the phase detector 26 then determines the condition of CDLY relative to the CIN signal (and the CIN1, CIN2 and CIN3 signals). Upon determining the relative timing condition of the signals, the phase detector 26 provides the signals 431 (PH1, PH2, PH11 and PH21) as appropriate for such condition, as indicated in FIG. 10, to the phase detection circuitry control block 430. In the embodiment shown, the steps 480-487 are arranged such that the conditions are determined by the phase detector 26 in a particular order, namely, the phase detector 26 first determines whether condition A has occurred and, if not, then determines whether condition C has occurred and, if not, then (in similar fashion) determines whether conditions B, D, E, H, F and G have occurred. In alternate embodiments, these steps could be performed in another order or all of the determinations could be made simultaneously.

Depending upon which of the conditions A-H has occurred, as indicated by the values of the signals 431 as discussed above, the phase detection circuitry control block 430 in turn generates the outputs 438, 440 for controlling which of the signals CIN, CIN1, CIN2 and CIN3 is output by the multiplexer 428, and further for controlling whether the multiplexer 46 provides the output signal SMDOUT 44 or the signal from the multiplexer 428 on connection 435 (e.g., one of CIN, CIN1, CIN2, or CIN3) onto the output line 50 for receipt by the edge recovery element 441. More particularly, as shown at a step 490, if condition A has occurred, then the control block 430 causes the signal CIN to be provided from the multiplexer 428 into the SMD 12, and causes the multiplexer 46 to provide the signal SMDOUT 44 onto the output line 50. Likewise, if conditions C, B, or D have occurred, respectively, then at steps 491, 492 or 493, respectively, the control block 430 causes CIN1, CIN2, or CIN3 respectively to be fed into the SMD 12 and causes the multiplexer 46 to provide the signal SMDOUT 44 onto the output line 50.

However, if any of conditions E, F, G, or H has occurred as shown at a steps 494-7, then the control block 430 controls the multiplexers 428, 46 so as to bypass the SMD 12 and instead provide one of signals CIN, CIN1, CIN2, or CIN3 onto the output line 50. More particularly, if condition E has occurred as shown at the step 494, then the control block 430 causes CIN to be output by the multiplexer 428 and also to be output by the multiplexer 46 by way of the connection 435. Likewise, if conditions H, F, or G occur as shown at the steps 495, 496 or 497, respectively, then the control block 30 causes CIN1, CIN2 or CIN3 respectively to be output by the multiplexer 428 and also to be output by the multiplexer 46 by way of the connection 435.

The result of each of the conditions A-H and related operations performed by the control block 430 in steps 490-497 is the appropriate locking of the timing of the signal provided on the output line 50, at a step 488. Once the appropriate "locked" signal is provided on the output line 50, edge recovery is performed upon that signal at a step 489 by the edge recovery element 441. Then, at a step 498 one or more signals 442 (see FIG. 7) are provided from the edge recovery element 441 to the clock tree 454, which in turn distributes one or more internal clock signals 456 based upon the signals 442, prior to the completion of the procedure of FIGS. 11A-B at a step 499.

As shown in FIG. 7, in the present embodiment, the signals 442 and the signals 456 each include four signals, which are generated by the edge recovery element 441 based upon the signal provided on the output line 50. In particular, each of these sets of signals 442, 456 includes one signal that has the same phase as the signal provided on the output line 50, a second signal that is 180 degree phase shifted relative to the first signal, and third and fourth signals that are respectively 90 degree phase shifted with respect to the first and second signals. The rising edges of the third and fourth signals represent the falling edges of the external clock signal 16. In alternate embodiments the signals 442, 456 could include more than four signals, different numbers of signals, or some other number of signals.

The system 400 as discussed above with reference to FIGS. 7-11A-B has certain advantages in comparison with the system 10 discussed with reference to FIGS. 1-6. In particular, the provision of three different signals as CIN' to the phase detector control block 414 (namely, CIN1, CIN2, and CIN3) allows the phase detector control block to make finer comparisons of those signals with the CDLY signal. Consequently, the phase detector control block 414 is able to more finely control the delays introduced by the SMD 12 when the output of the SMD is provided on the output line 50 of the phase detector control block, as well as able to better identify situations in which the SMD can be bypassed altogether. More particularly, the system 400 of FIG. 7 makes it possible for to identify eight different conditions (including the four "locked" conditions E-H) rather than merely the four different conditions (including the two "locked" conditions) that are identifiable by the system 10 of FIG. 1.

As a result, the maximum delay required by the system 400 to cover all timing cases is reduced to $t_{ck}/4$ from the maximum delay $t_{ck}/2$ required by the system 10. Thus, in the case where the internal clock period $t_{ck}$ is 5 ns (which, due to the "divide-by-two" clock divider 19, corresponds to an external clock period $t_{cke}$ of 2.5 ns), $$N_{worst} = \frac{5ns/4 - 1ns}{110ps} \approx 2 \text{ stages.}$$

This is a significant reduction from the figure calculated with respect to the system 10, in which about 14 stages are necessary, and an even greater reduction from the figure calculated above in the Background of the Invention section (36 stages) concerning embodiments that do not employ the present invention.

Although FIGS. 7-11A-B are representative of one alternate embodiment to the system 10 of FIGS. 1-6, this alternate embodiment is only exemplary of numerous such alternate embodiments in which the number of signals provided to the phase detector control block was greater than three and, in particular, included more than one signal corresponding to CIN'. Indeed, such alternate embodiments could include eight, sixteen or other numbers of signals, including numbers that were not multiples of two. The number of signals could, but need not, naturally follow from the reduction in frequency performed by the clock divider. For example, if the clock divider provided a reduction in frequency by a factor of four, then eight signals might be provided to the phase detector control block. Also, while the various signals CIN and CIN' (e.g., CIN1 . . . CINn) provided to the phase detector control block can be timed, relative to one another, in the manner shown in FIG. 8 (e.g., where the different signals have edges that are successively spaced in a substantially equidistant manner relative to one another), the various signals need not be spaced in this manner.

Figure 12:
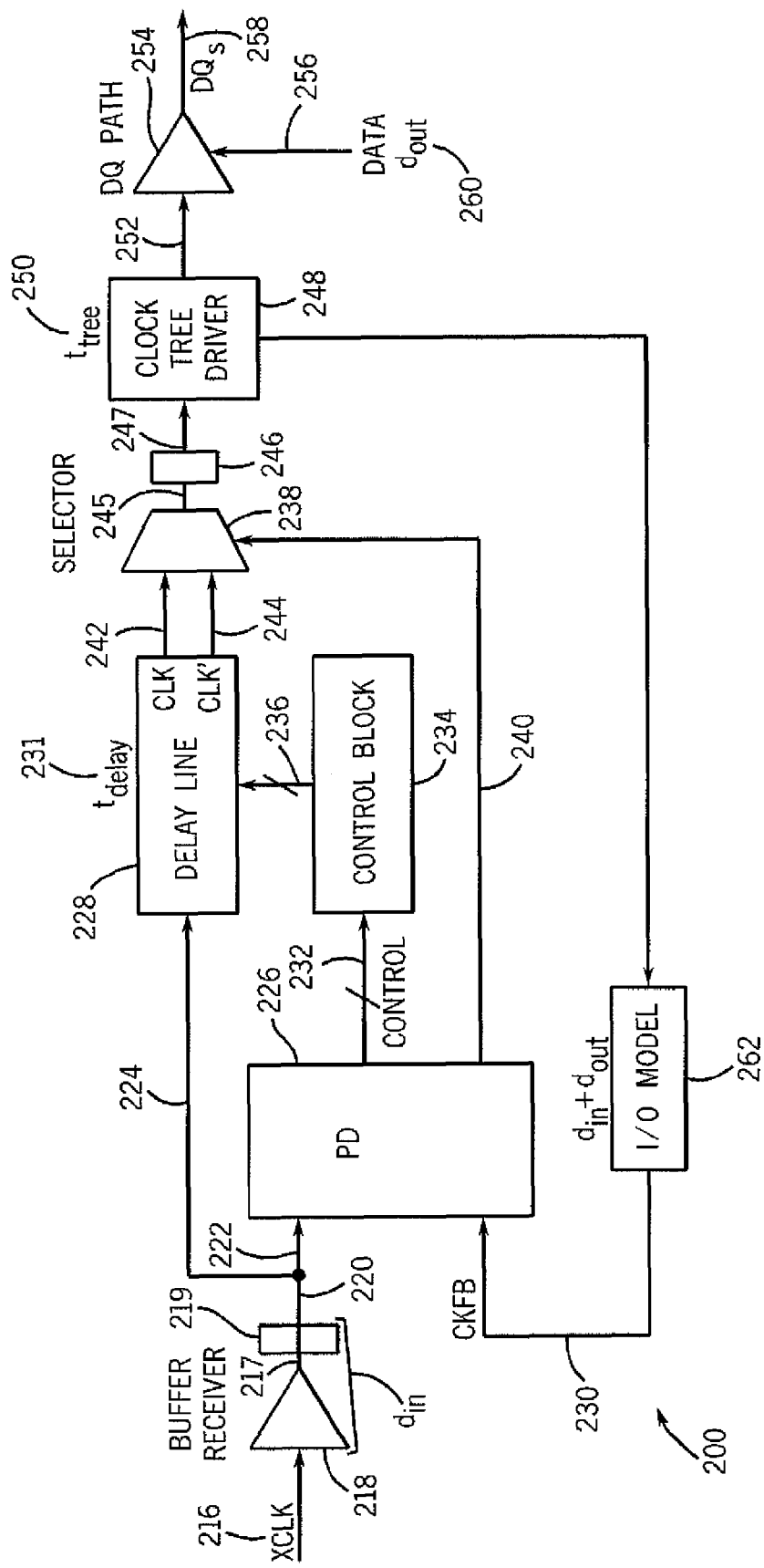
FIG. 12 is a block diagram of a delay-locked loop system with phase detection in accordance with a further embodiment of the present invention.

Referring now to FIG. 12, an alternate embodiment of the present invention is shown being used in a delay-locked loop or DLL, which is shown generally by the numeral 200. An external clock signal 216 is input into receiver and buffer 218. This produces clock input signal 217. The clock input signal 217 is then provided to a clock divider 219, which can be identical to the clock divider 19 discussed above with respect to FIG. 1 except insofar as it only outputs a single signal, a modified clock input signal (CIN) 220. The delay in the signal as it passes through buffer receiver 218 and the clock divider 220 is represented by $d_{in}$. The clock divider 219, as with the clock divider 19, serves to reduce the frequency of the clock signal, resulting in lessened attenuation and power usage associated with propagation of the clock signal and related signals.

CIN 220 is then input via branch 222 into phase detector 226. CIN 220 is also directed via branch 224 into delay line 228. Phase detector 226 can include any associated logical circuitry. A significant purpose of the present circuit is to take CIN 220 as well as a clock feedback signal 230 (CKFB) and, by defining particular characteristics and relationships about the timing of CIN 220 and CKFB, to delineate specific conditions under which the signals are operating, and select and direct the signals accordingly. Although a specific logic arrangement is shown, it is contemplated that any suitable control logic can be used to define the conditions of the signals and then selecting them accordingly.

CKFB 230 is provided by way of a typical feedback loop as is found in a common delayed-lock loop (DLL). Phase detector 226 compares the timing of CIN 220 and CKFB 230. Based on timing conditions and characteristics of each of these signals, control signals are sent via control lines 232 to control block 234 and output via lines 236 to delay line 228. The period of the delay is represented by $t_{delay}$ 231. Associated with the delay line 228 is selector 238, which receives an input 240 from the phase detector 226 as well as inputs 242 and 244 representative of the clock (CLK) and inverted clock (CLK') signals, respectively. While in FIG. 12 the selector 238 is shown to be positioned after the delay line 228, in alternate embodiments the selector can also be positioned in front of the delay line.

Selector 238 selects, based on the input 240 from the phase detector 226, whether to put signal 242 or signal 244 to input 245 of an edge recovery (or phase generation) element 246, which in turn provides an input 247 into clock tree driver 248. The edge recovery (or phase generation) element 246 can be the same as or similar to the edge recovery element 41 discussed with reference to FIG. 1, and provides the same benefits in terms of recovering edge information and alleviating duty cycle distortion. The period of delay by the driver (and any delay introduced by the edge recovery element) is represented by $t_{tree}$ 250.

The output 252 of the clock tree driver 248 is sent to an output buffer 254, which has an input data line 256 and a data output line 258, on which is output a signal DQs. The delay by the output of data is represented by the parameter $d_{out}$ 260. Clock tree driver 248, as part of the delay-locked loop, feeds back into phase detector 226 via line 230. The delay associated with the IO model 262, which includes delay components corresponding to the receiver/buffer 218 and the clock divider 219 ($d_{in}$), and the output buffer 254 ($d_{out}$), is represented by the parameter $d_{in}+d_{out}$.

Generally speaking,

1. In order to synchronize XCLK with DQs, $$t_{delay}=t_{ck}-t_{tree}-(d_{in}+d_{out})$$

In traditional DLLs, the delay stages required are:

$$N = \frac{t_{delay}}{t_d} = \frac{t_{ck}-t_{tree}-(d_{in}+d_{out})}{t_d}$$

$$N_{worst} = \frac{t_{ck}(\text{long})-t_{tree}(\text{short})-(d_{in}+d_{out})(\text{fast})}{t_d(\text{fast})}$$

$$= \frac{5n-1n}{110ps} \approx 36$$

2. Use same method, adding a selector $$t_e < t_{ck}/2, \; t_{delay}=t_{ck}/2-t_e$$

$$t_e > t_{ck}/2, \; t_{delay}=t_{ck}-t_e$$

where, for both cases, the parameter $t_e$ represents the amount of time from a rising edge of CIN to the nearest subsequent rising edge of CKFB, and $t_{delay}$ is less than or equal to $t_{ck}/2$:

$$N_{worst} = \frac{t_{ck}/2(\text{long})-\text{others}}{t_d(\text{fast})} = \frac{2.5n-1n}{110ps} \approx 14$$

Figure 13:
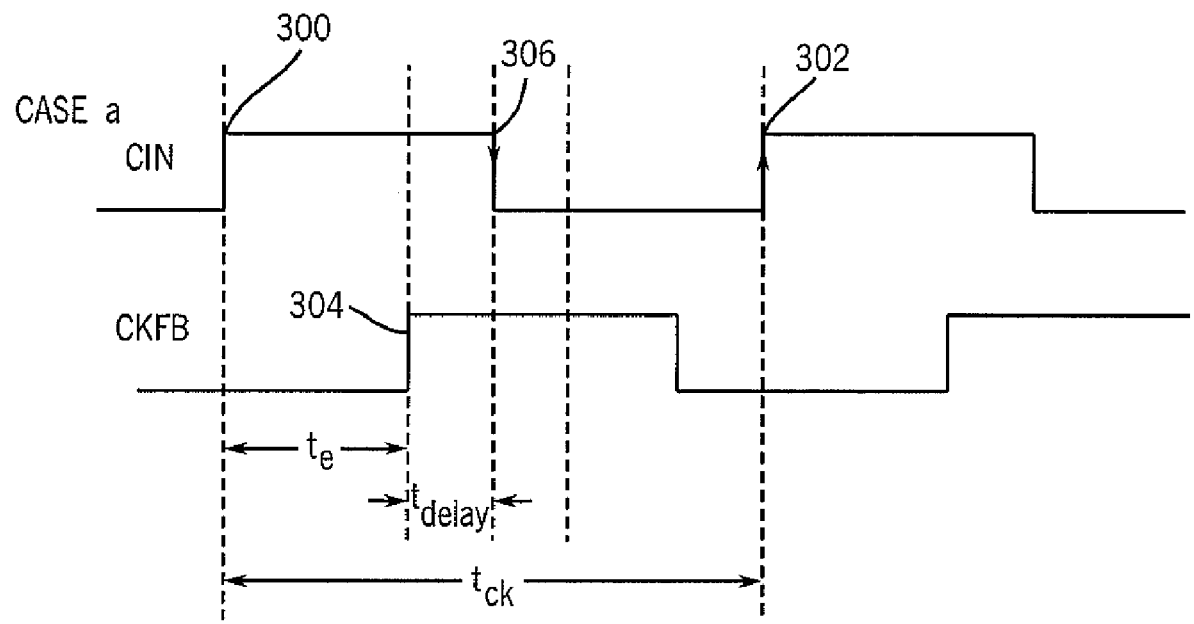
FIG. 13 is a signal timing diagram showing the timing of a clock input signal and a clock feedback signal of the system of FIG. 12 in accordance with one aspect of the present invention.

Referring now to FIG. 13, a timing diagram for signals CIN and CKFB are shown in a particular arrangement (case a). The period from the rising edge 300 to rising edge 302 is designated as $t_{ck}$. The amount of time from rising edge 300 of CIN to rising edge 304 of CKFB is represented by the parameter $t_e$. Additionally, the period from the rising edge 304 of CKFB to the falling edge 306 of CIN is represented by the parameter $t_{delay}$. In this case, $t_{delay}$ is less than or equal to half of $t_{ck}$.

Figure 14:
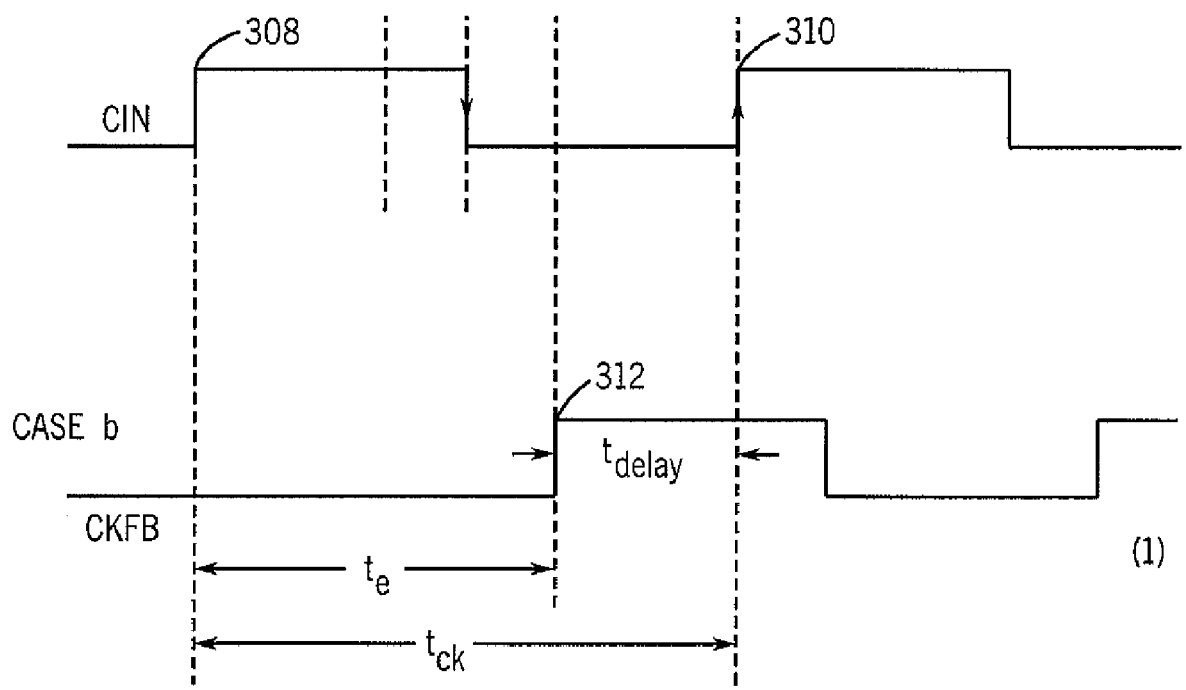
FIG. 14 is a signal timing diagram showing additional timing of a clock input signal and a clock feedback signal of the system of FIG. 12 in accordance with one aspect of the present invention.

Referring now to FIG. 14, a second case (case b) is illustrated where CKFB does not fire until after the first pulse of CIN. Again, $t_{ck}$ is represented by the rising edge 308 of CIN and the next rising edge 310 of CIN. Additionally, the length of time from the rising edge 308 to the rising edge 312 of CKFB is shown by the parameter $t_e$. However, in this instance, $t_{delay}$ is measured from the rising edge 312 of CKFB until the next rising edge 310 of CIN. Similarly, in this case, $t_{delay}$ is less than or equal to one-half of the clock period $t_{ck}$.

The system 200 shown in FIG. 12 provides only the CIN signal 220 and the CKFB signal 230 to the phase detector 226, only provides the CLK and CLK' signals 242, 244 to the selector 238, and subsequently only provides the respective single input/output 245, 247 and 252 to the edge recovery element 246, the clock tree driver 248 and the output buffer. Nevertheless, in alternate embodiments this need not be the case. Rather, similar to the discussion above relating to FIG. 7, modified versions of the system 200 of FIG. 12 could utilize and provide more than those signals that are shown.

For example, in one alternate embodiment employing the clock divider 219 that divides the frequency of the external clock signal 216 by two, not only the CIN signal 220 and the CKFB signal 230 are provided to the phase detector 226, but also an additional CIN' signal is provided to the phase detector, where the CIN' signal could be (as in the case of the CIN1 signal of the system 400 of FIG. 7) delayed by about 90 degrees relative to the CIN signal. Also, the delay line 228 could result in the production of not just the CLK signal 242 but also three signals corresponding to the CLK' signal 244 (e.g., CLK1, CLK2 and CLK3 signals). Further, each of the input 247 and output 252 could be modified to include four signals rather than merely one. As with the system 200, this modified version of that system could employ a selector corresponding to the selector 238 after the delay line, albeit such selector would preferably be positioned before the delay line. The same or similar logic as that discussed with reference to the system 400 of FIG. 7 could be employed to generate the multiple signals (e.g., CLK1, CLK2 and CLK3) corresponding to the CLK' signal.

Thus, the system 200 could be modified in a manner analogous to the manner the system 10 of FIG. 1 was modified to achieve the system 400 of FIG. 7, such that the modified version of system 200 would achieve similar benefits in relation to the system 200 as those achieved by the system 400 in relation to the system 10. In particular, such a modified version of the system 200 would make finer timing comparisons and consequently more finely control the delays introduced by the DLL.

Further, as discussed above with reference to the system 400 of FIG. 7, the aforementioned manner of modifying the system 200 is only one example of many different possible manners of modifying that system. That is, it is envisioned that the system 200 could be modified so as to have any number of signals corresponding to CLK' and any number of signals corresponding to the input 247 and output 252 shown in FIG. 12.

Although not necessarily the case in all embodiments, in certain embodiments the systems 10, 200 and 400 shown in (and other systems discussed with reference to) FIGS. 1-14 only operate to select among different signals as discussed above during the starting up or resetting of the clock circuitry. Once the appropriate signal for output as a clock signal is determined by the selecting mechanisms of these systems, the selecting mechanisms effectively shut off their phase selection capabilities and disable the unselected signals to save power.

Figure 15:
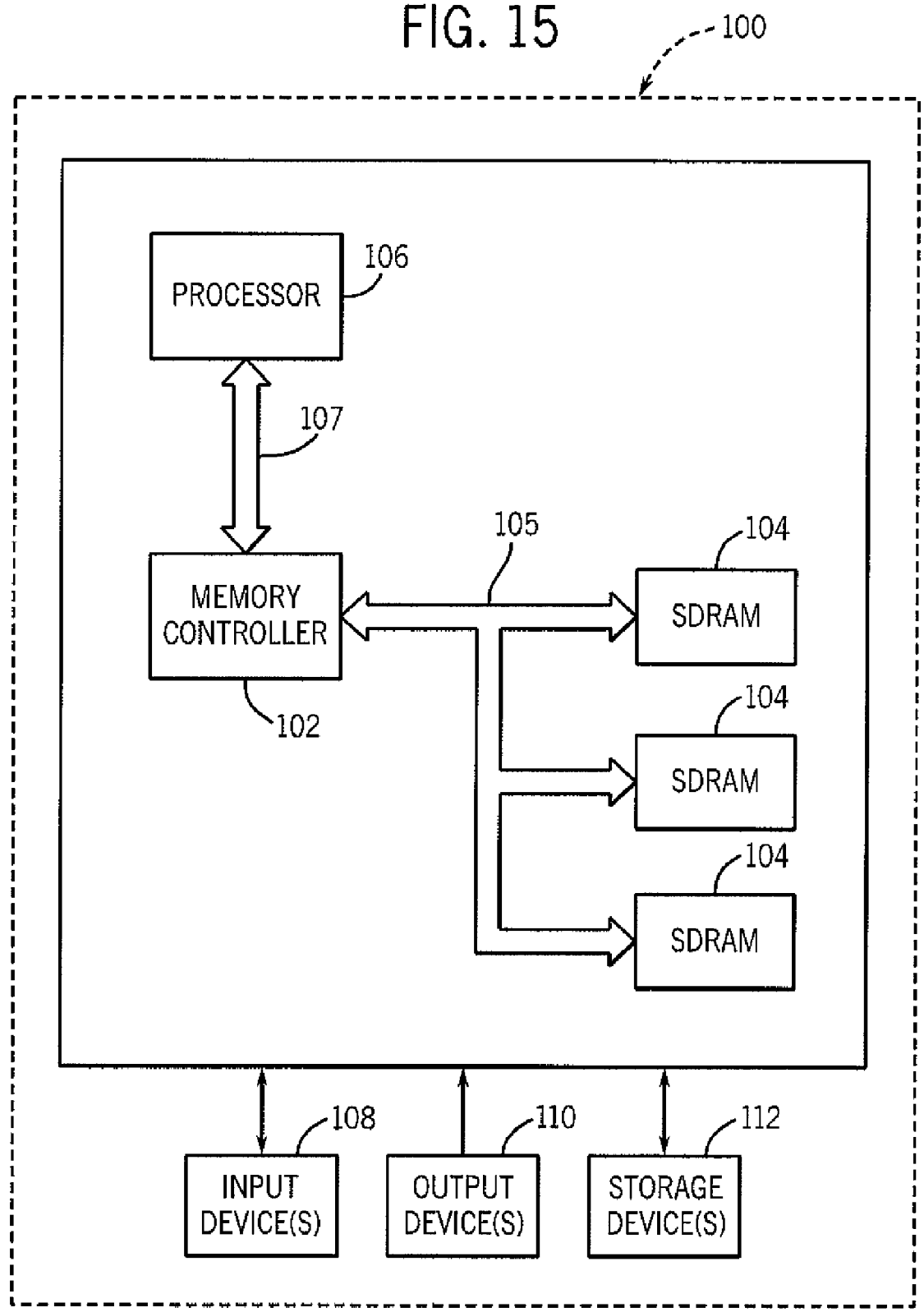
FIG. 15 is a block diagram illustrating an exemplary computer system in which can be employed the systems of FIGS. 1, 7 and 12 and other related systems in accordance with various embodiments of the present invention.

Turning to FIG. 15, that figure shows a block diagram of a computer system 100. The computer system 100 utilizes a memory controller 102 in communication with SDRAMs 104 by way of a bus 105. The memory controller 102 is also in communication with a processor 106 by way of a bus 107. The processor 106 can perform a plurality of functions based on information and data stored in the SDRAMs 104. In certain embodiments, the SDRAMs 104 (or other memory device) constitutes or includes a computer readable medium that stores computer executable instructions and/or computer algorithms to be executed by the processor 106. The execution of the computer executable instructions/algorithms on the processor 106 or other programmable data processing apparatus can create means for implementing various functions or performing various methods.

One or more input devices 108, such as a keypad or a mouse, are connected to the processor 106 to allow an operator to manually input data, instructions, etc. One or more output devices 110 are provided to display or otherwise output data generated by the processor 106. Examples of output devices include printers and video display units. One or more data storage devices 112 can be coupled to the processor 106 to store data on, or retrieve information from, external storage media. Examples of storage devices 112 and storage media include drives that accept hard and floppy disks, tape cassettes, and CD read only memories.

Although the term "computer system" is utilized with respect to FIG. 15, it should be understood that the term is intended to encompass a wide variety of systems that employ one or more processing devices, including processing device(s) that employ or utilize software, which can be (for example) electronically read from a data storage device or memory device. The processing devices/processors can be or include, for example, one or more microprocessors, one or more Application-Specific Integrated Circuits (ASICs), or any other combinations of hardware and/or software.

Figure 16:
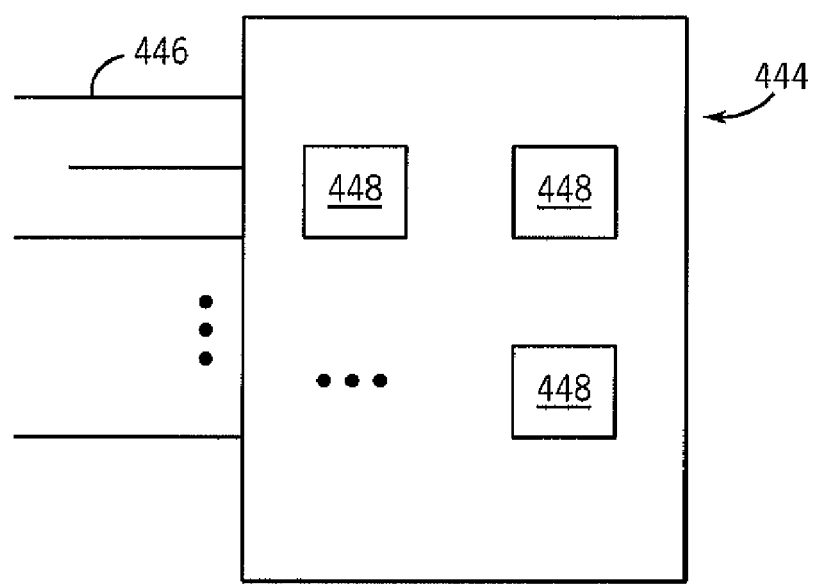
FIG. 16 is a block diagram of a circuit module according to at least one embodiment of the present invention.

FIG. 16 is a block diagram of an embodiment of an exemplary circuit module 444 in which the present invention can be incorporated, at least in certain embodiments. Such modules, devices and systems (e.g., processor systems) incorporating the module 444 are described and illustrated in U.S. Pat. Nos. 6,437,417 (Gilton) and 6,465,828 (Agarwal), the disclosures of which are hereby incorporated by reference herein. In brief two or more dies 448 can be combined into the circuit module 444 to enhance or extend the functionality of an individual die. The circuit module 444 can be a combination of dies representing a variety of functions, or a combination of dies containing the same functionality.

Some examples of applications of circuit modules such as the circuit module 444 include memory modules (e.g., on a SDRAM), device drivers (e.g., on a BIOS or EPROM), power modules, communication modems, processor modules, and application-specific modules, and can include multilayer, multichip modules. The circuit module 444 can be a subcomponent of a variety of electronic systems, such as a clock, a television, a cell phone, a personal computer, an automobile, an industrial control system, an aircraft, among others. As shown, the circuit module 444 typically will have a variety of leads 446 extending therefrom and coupled to the dies 448 providing unilateral or bilateral communication and control.

The circuit module can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system such as that discussed above with reference to FIG. 15, e.g., a computer system including a processor and a memory system as a subcomponent, and optionally user interface components, and other associated components such as modems, device interface cards, etc.

Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), other non-volatile memories, as well as Synchlink or Rambus DRAMs and other emerging memory technologies.

While the present invention has been described in conjunction with preferred embodiments thereof, many modifications and variations will be apparent to those of ordinary skill in the art. For example, although the present invention is directed to synchronous mirror delay systems, the present invention is contemplated to be used with any implementable logic devices and in other arrangements, such as in a digital delay locked loop (DDLL), to improve the efficiency in that arrangement. The foregoing description and the following claims are intended to cover all such modifications and variations.

What is claimed is:

1. A method of operating a delay-locked loop circuit comprising:
    receiving a first clock signal;
    generating a plurality of modified clock signals based upon the first clock signal and having a reduced frequency relative to an initial frequency of the first clock signal;
    providing a feedback signal in addition to the modified clock signals, wherein the feedback signal also shares the reduced frequency;
    detecting phase information concerning at least two of the feedback signal and the modified clock signals; and
    selectively inputting a signal related to one of the modified clock signals into a delay-locked loop (DLL) based on the phase information.

2. The method of claim 1, wherein the plurality of modified clock signals includes a primary modified clock signal and a first additional modified clock signal.

3. The method of claim 2, wherein the plurality of modified clock signals further includes second and third additional modified clock signals.

4. The method of claim 2, wherein the first clock signal is provided to a clock divider device that reduces the frequency of the first clock signal.

5. The method of claim 2, wherein the phase information is detected by comparing first and second times at which edges of two of the feedback signal and the modified clock signals occur.

6. The method of claim 2, further comprising recovering edge information associated with at least one of the modified clock signals and the feedback signal.

7. The method of claim 3, wherein the primary modified clock signal (CIN) is derived based upon rising edges of the first clock signal, wherein the first additional modified clock signal (CIN1) is derived based upon falling edges of the first clock signal, wherein the second additional modified clock signal (CIN2) is inverted in relation to the CIN, and wherein the third additional modified clock signal (CIN3) is inverted in relation to the first additional modified clock signal.

8. The method of claim 6, wherein the recovering of the edge information is performed by at least one of an edge recovery device and a phase generation device.

9. The method of claim 8, wherein the reducing of the frequency is performed by a clock divider device, and wherein at least one of the clock divider device, the edge recovery device and the phase generation device alleviates duty cycle distortion.

10. The method of claim 9, wherein at least one of an attenuation level and a power dissipation level associated with propagation of at least one of the modified clock signals, the feedback signal, and a further signal based upon at least one of the first clock signal and the feedback signal is reduced due to the reducing of the frequency.

11. A memory device comprising:
    an input terminal that receives a first clock signal having an initial frequency;
    a clock divider that generates a primary modified clock signal having a reduced frequency in comparison with the initial frequency, wherein the primary modified clock signal is generated at least indirectly based upon the first clock signal;
    a delay-locked loop (DLL) that provides a feedback signal;
    a phase detector that is connected at least indirectly to the DLL and to the clock divider, and that receives both the primary modified clock signal and the feedback signal; and a selector that is coupled at least indirectly to the clock divider, wherein the selector is controlled by the phase detector in order to select a further signal upon which the output signal is based at least indirectly, wherein the phase detector determines timing characteristics based upon at least two of the primary modified clock signal, at least one additional modified clock signal, and the feedback signal, wherein the further signal is selected from among the primary modified clock signal and the at least one additional modified clock signal, and wherein the output signal is determined based upon the timing characteristics.

12. The memory device of claim 11, wherein the at least one additional modified clock signal includes a first additional modified clock signal.

13. The memory device of claim 12, wherein the at least one additional modified clock signal also includes second and third additional modified clock signals, and wherein the selected signal is one of the primary modified clock signal (CIN), the first additional modified clock signal (CIN1), the second additional modified clock signal (CIN2), and the third additional modified clock signal (CIN3).

14. The memory device of claim 12, further comprising at least one of an edge recovery device and a phase generation device coupled to the selector.

15. A memory device comprising circuitry to:
receive a first clock signal having an initial frequency;
provide a delay signal and a plurality of modified clock signals based upon the first clock signal, each of which has a reduced frequency relative to the initial frequency;
compare at least one of the modified clock signals with the delay signal;
select one of the modified clock signals based upon a result of the comparing; and
generate an output signal based at least in part on the selected one of the modified clock signals, wherein the output signal in at least some circumstances is provided by a synchronous mirror delay (SMD).

16. The memory device of claim 15, wherein the modified clock signals include a primary modified clock signal (CIN) and at least one additional modified clock signal (CIN').

17. The memory device of claim 16, wherein the at least one additional modified clock signal includes first, second and third additional modified clock signals.

18. The memory device of claim 15, wherein the circuitry further is to recover edge information.

19. A semiconductor memory device comprising the memory device of claim 15.

20. A Dynamic Random Access Memory (DRAM) comprising the semiconductor memory device of claim 19.

21. A Synchronous Dynamic Random Access Memory (SDRAM) comprising the semiconductor memory device of claim 19.

22. A memory device comprising circuitry to:
receive a first clock signal having an initial frequency;
provide a plurality of modified clock signals based upon the first clock signal, each of which has a reduced frequency relative to the initial frequency;
compare at least one of the modified clock signals with a feedback signal provided by way of a delay-locked loop (DLL);
select one of the modified clock signals based upon a result of the comparing; and
generate an output signal based at least indirectly upon the selected one of the modified clock signals.

23. The memory device of claim 22, wherein the modified clock signals include a primary modified clock signal (CIN) and at least one additional modified clock signal (CIN').

24. The memory device of claim 23, wherein the at least one additional modified clock signal includes first, second and third additional modified clock signals.

25. The memory device of claim 22, wherein the circuitry further is to recover edge information.

26. A semiconductor memory device comprising the memory device of claim 22.

27. A Dynamic Random Access Memory (DRAM) comprising the semiconductor memory device of claim 26.

28. A Synchronous Dynamic Random Access Memory (SDRAM) comprising the semiconductor memory device of claim 26.

29. Circuitry configured to:
receive a first clock signal having an initial frequency;
provide a delay signal and a plurality of modified clock signals based upon the first clock signal, each of which has a reduced frequency relative to the initial frequency;
compare at least one of the modified clock signals with the delay signal;
select one of the modified clock signals based upon a result of the comparing; and
generate an output signal based at least in part on the selected one of the modified clock signals, wherein the output signal in at least some circumstances is provided by a synchronous mirror delay (SMD).

30. Circuitry configured to:
receive a first clock signal having an initial frequency;
provide a plurality of modified clock signals based upon the first clock signal, each of which has a reduced frequency relative to the initial frequency;
compare at least one of the modified clock signals with a feedback signal provided by way of a delay-locked loop (DLL);
select one of the modified clock signals based upon a result of the comparing; and
generate an output signal based at least indirectly upon the selected one of the modified clock signals.

31. An electronic system comprising:
a processor; and
an integrated circuit in communication with the processor, wherein the integrated circuit includes
an input terminal that receives a first clock signal having an initial frequency;
a clock divider that generates a primary modified clock signal having a reduced frequency in comparison with the initial frequency, wherein the primary modified clock signal is generated at least indirectly based upon the first clock signal;
a delay-locked loop (DLL) that provides a feedback signal;
a phase detector that is connected at least indirectly to the DLL and to the clock divider, and that receives both the primary modified clock signal and the feedback signal; and
a selector that is coupled at least indirectly to the clock divider, wherein the selector is controlled by the phase detector in order to select a further signal upon which the output signal is based at least indirectly, wherein the phase detector determines timing characteristics based upon at least two of the primary modified clock signal, at least one additional modified clock signal, and the feedback signal, wherein the further signal is selected from among the primary modified clock signal and the at least one additional modified clock signal, and wherein the output signal is determined based upon the timing characteristics.

32. The system of claim 31, wherein the at least one additional modified clock signal includes first, second and third additional modified clock signals, and wherein the system includes at least one of an input device, an output device, and a memory controller coupled to the processor.

* * * * *